(12) United States Patent
Hamada et al.

(10) Patent No.: US 12,004,349 B2
(45) Date of Patent: Jun. 4, 2024

(54) SEMICONDUCTOR DEVICE AND METHOD FOR MANUFACTURING THE SAME

(71) Applicant: Kioxia Corporation, Tokyo (JP)

(72) Inventors: Tatsufumi Hamada, Nagoya Aichi (JP); Tomohiro Kuki, Yokkaichi Mie (JP); Yosuke Mutsuno, Yokkaichi Mie (JP); Shinichi Sotome, Yokkaichi Mie (JP); Ryota Suzuki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 338 days.

(21) Appl. No.: 17/459,825

(22) Filed: Aug. 27, 2021

(65) Prior Publication Data

US 2022/0278124 A1 Sep. 1, 2022

(30) Foreign Application Priority Data

Mar. 1, 2021 (JP) .................. 2021-032083

(51) Int. Cl.
*H10B 43/27* (2023.01)

(52) U.S. Cl.
CPC ..................... *H10B 43/27* (2023.02)

(58) Field of Classification Search
CPC ................ H10B 43/27; H10B 41/27
See application file for complete search history.

(56) References Cited

U.S. PATENT DOCUMENTS

| 10,475,879 B1 | 11/2019 | Pachamuthu et al. |
| 2017/0025423 A1 | 1/2017 | Terada et al. |
| 2018/0331117 A1 | 11/2018 | Titus et al. |
| 2019/0214405 A1 | 7/2019 | Shirai et al. |

FOREIGN PATENT DOCUMENTS

TW 201717362 A 5/2017

*Primary Examiner* — Anthony Ho
(74) *Attorney, Agent, or Firm* — Foley & Lardner LLP

(57) ABSTRACT

A semiconductor device includes: a first stacked film including first electrode layers; an insulating layer provided on the first stacked film; a second stacked film provided on the insulating layer and including second electrode layers; and a columnar portion extending through the first stacked film, the insulating layer, and the second stacked film. The columnar portion extending in the insulating layer includes a first portion having a first width in a second direction intersecting the first direction, and a second portion provided at a different location along the first direction and having a second width in the second direction. The columnar portion extending in the second stacked film includes a third portion having a third width along the second direction. The second width is larger than the first width and the third width.

17 Claims, 23 Drawing Sheets

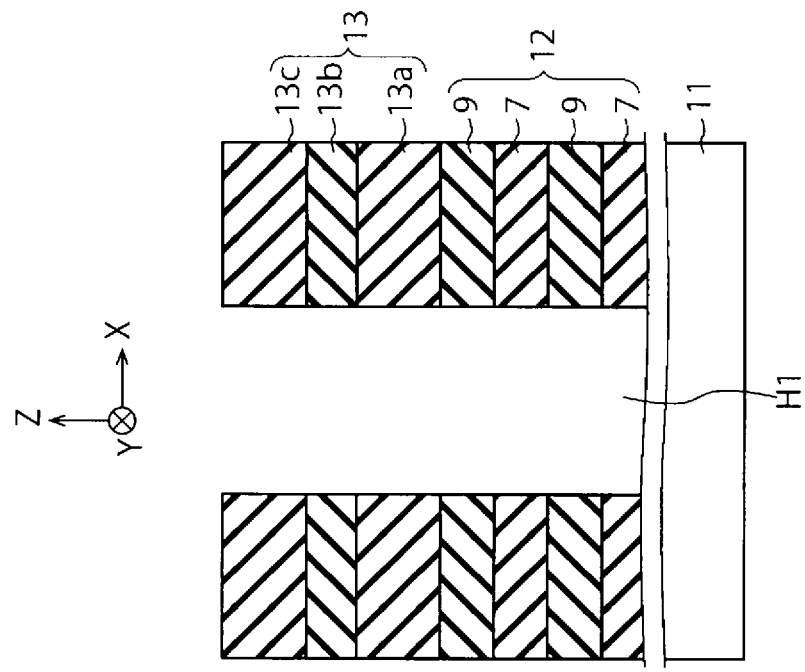
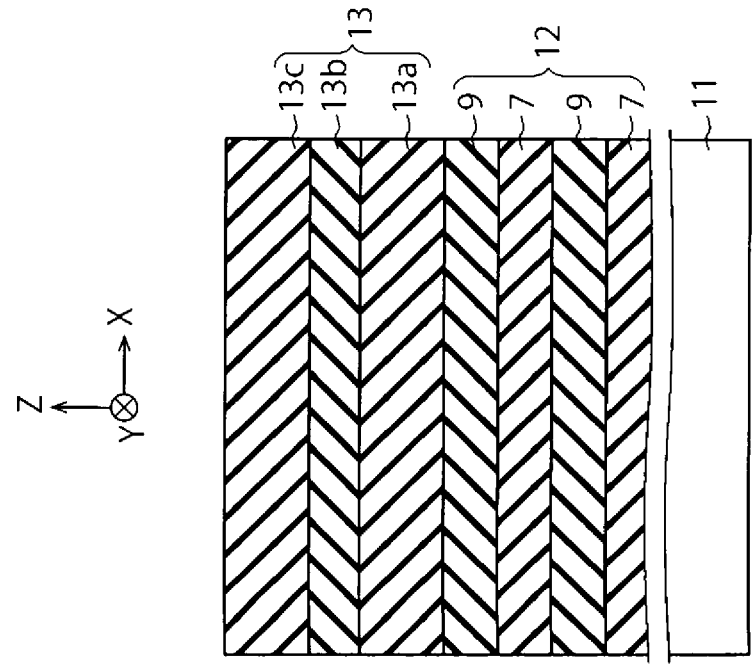

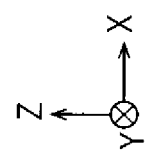
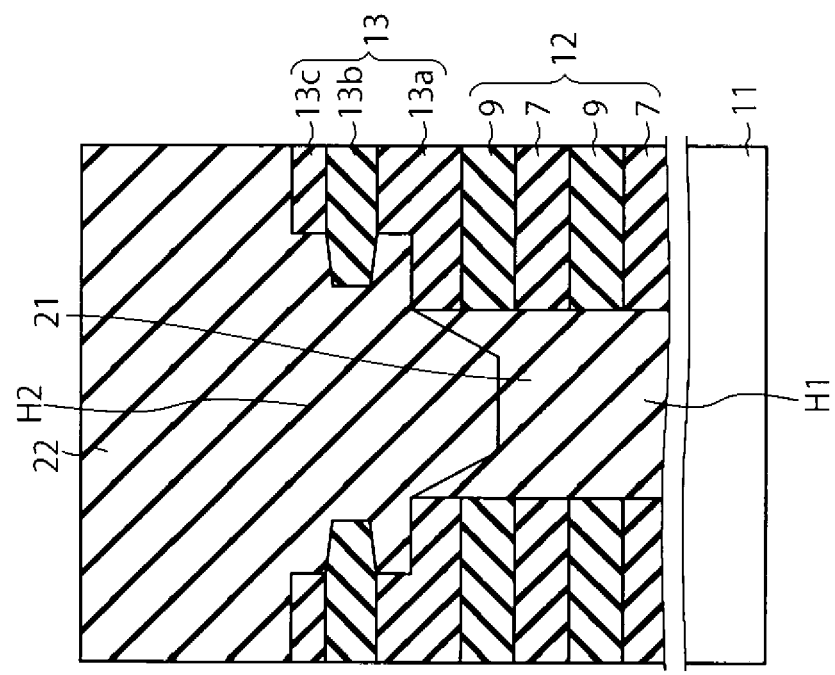
FIG. 6B
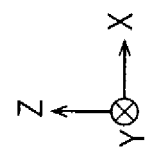
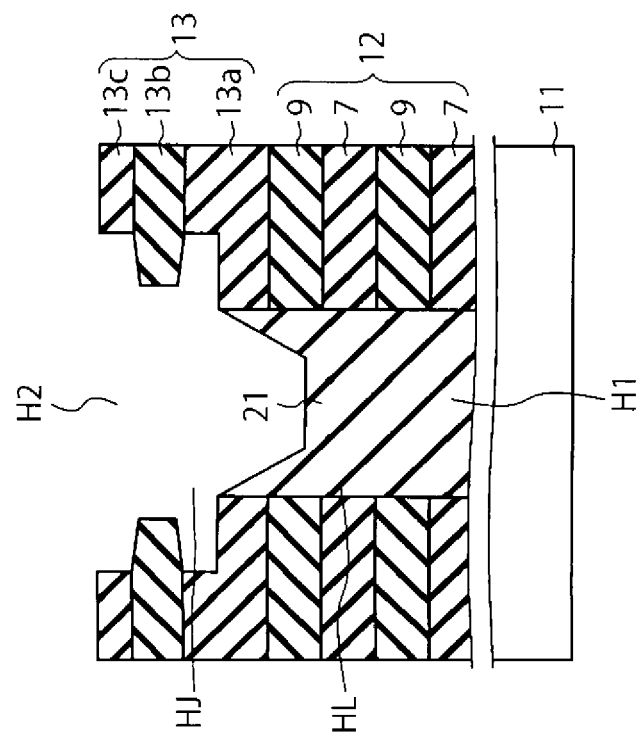
FIG. 6A

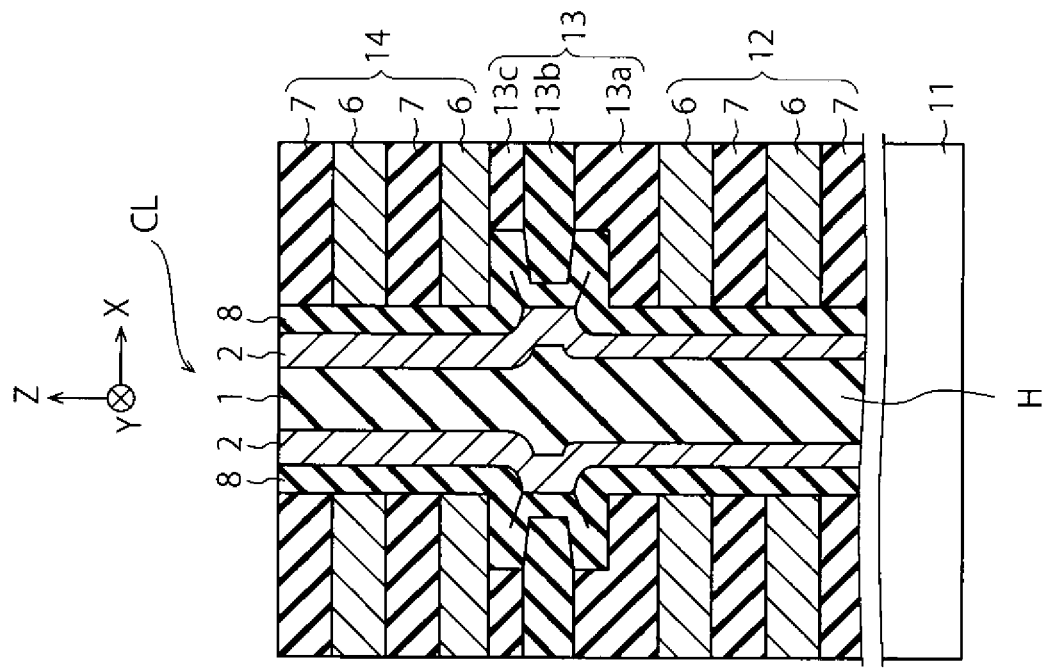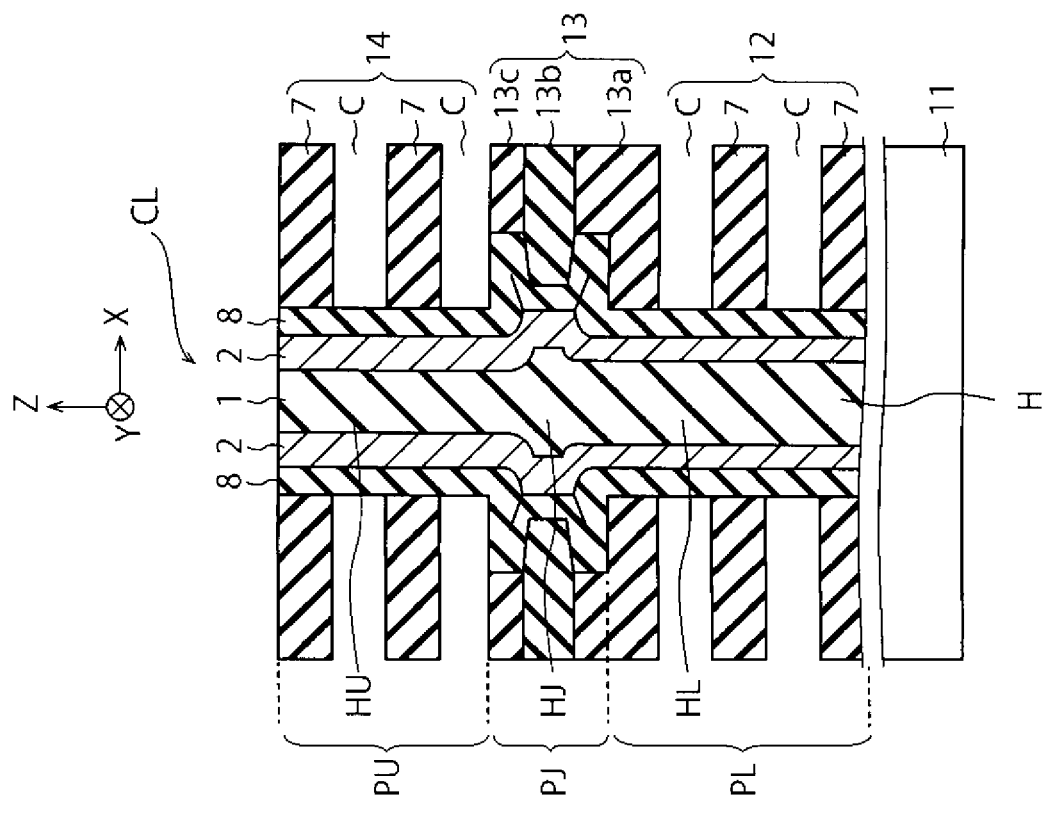

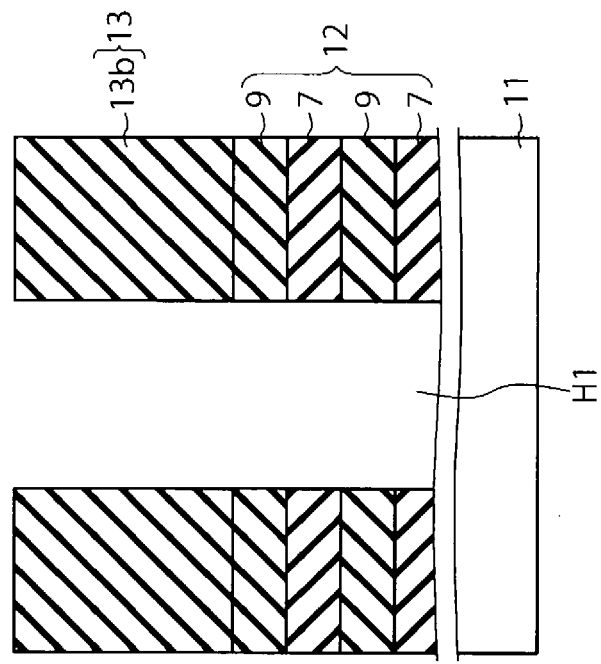
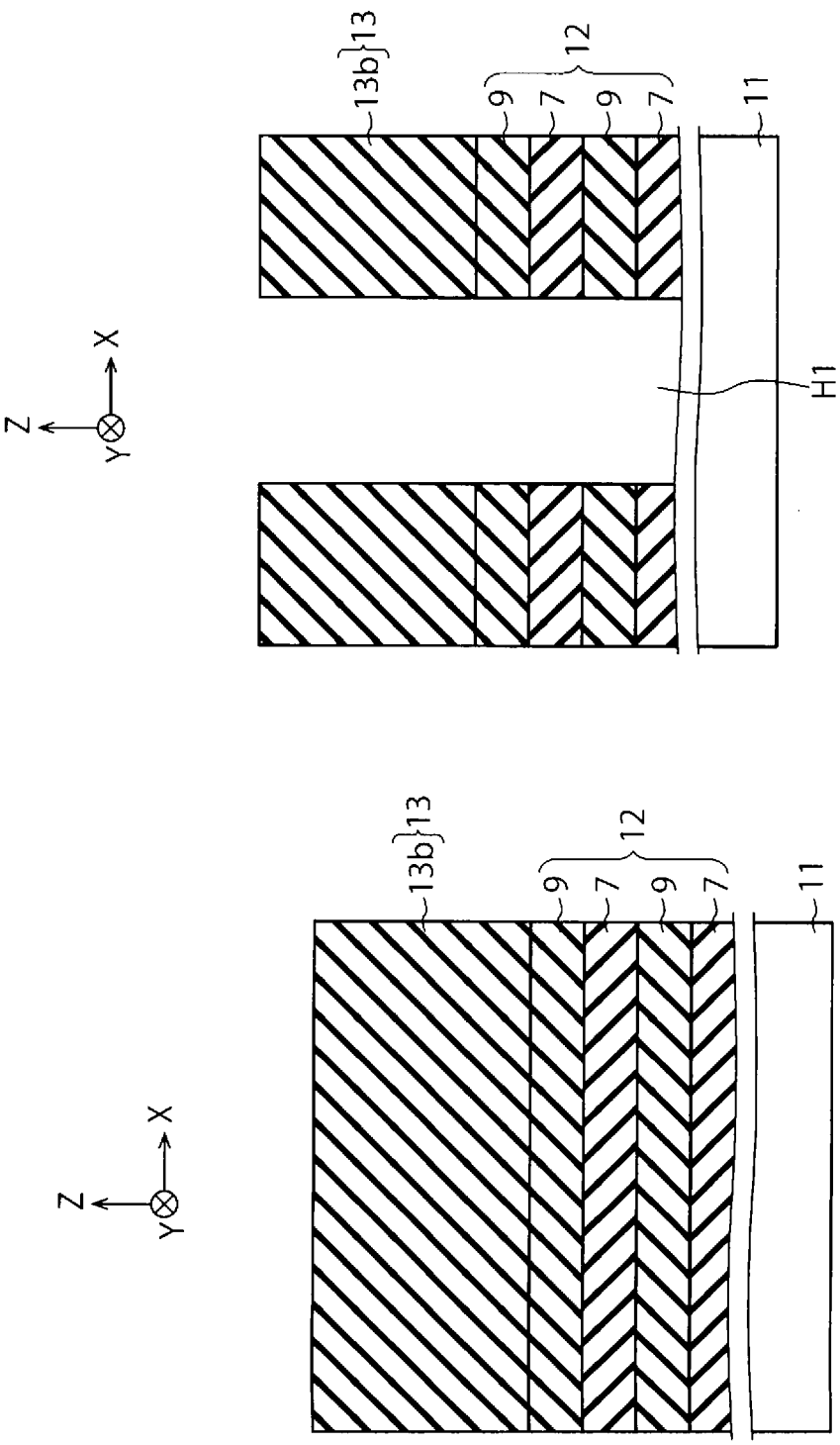

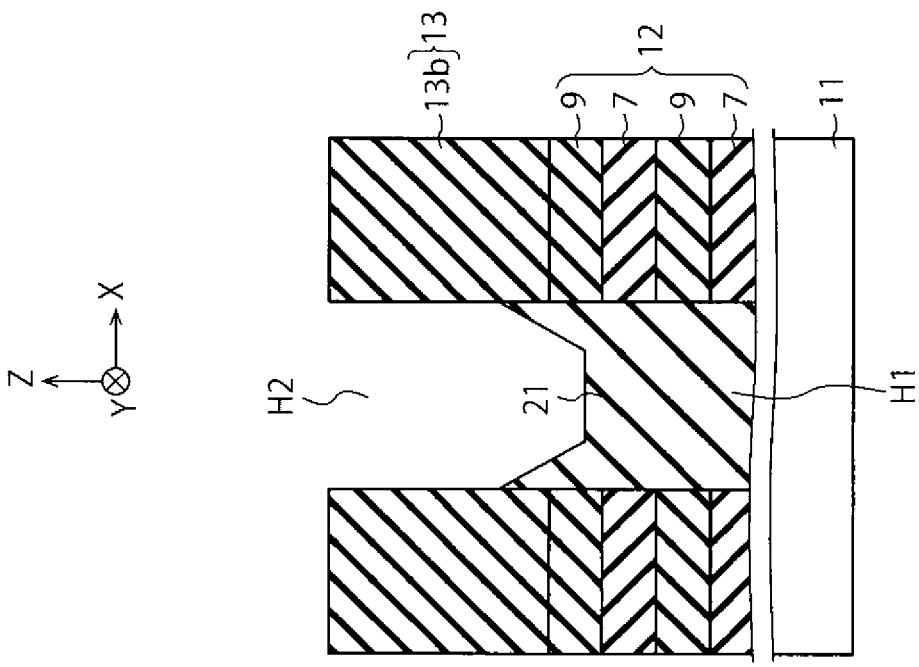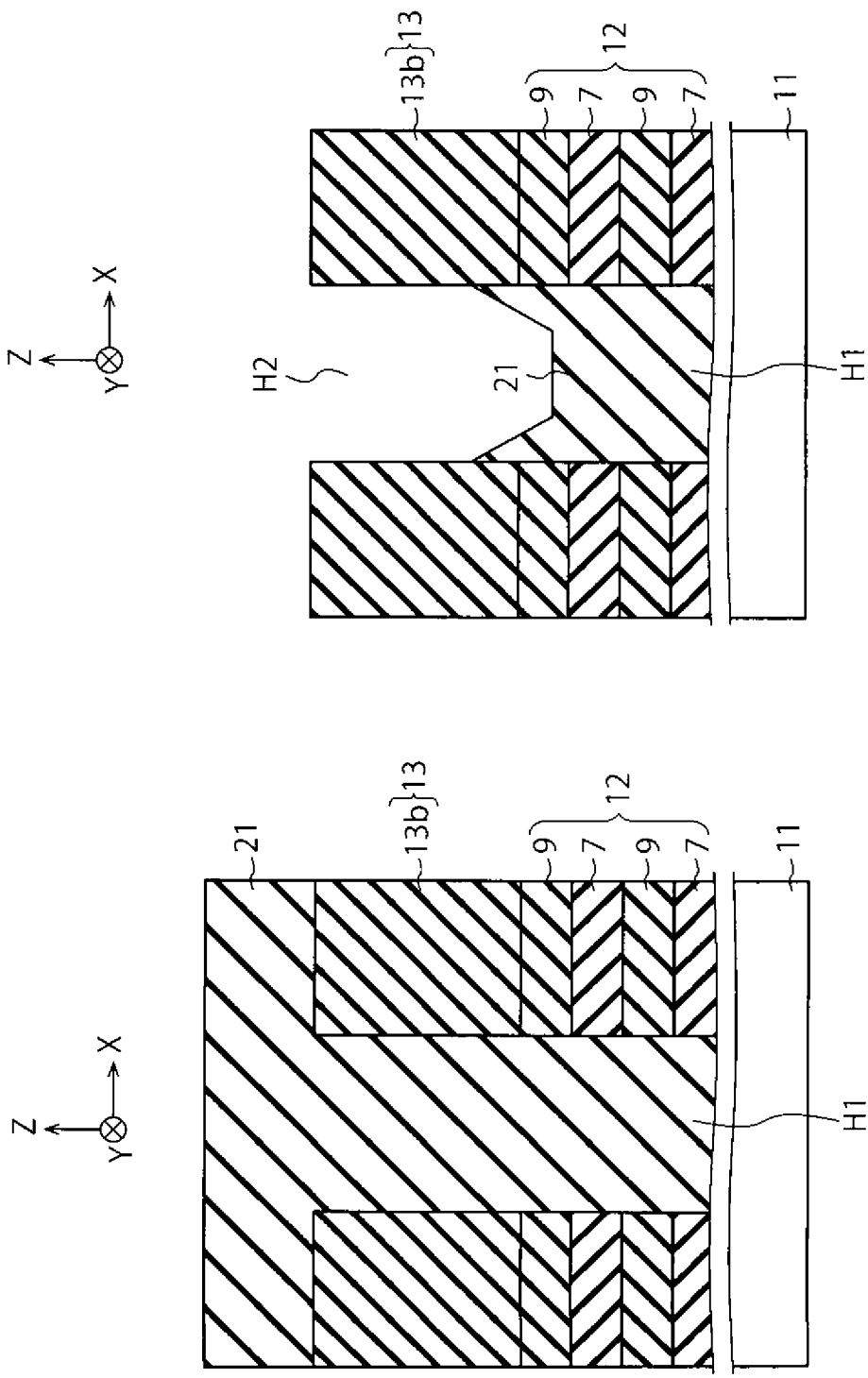

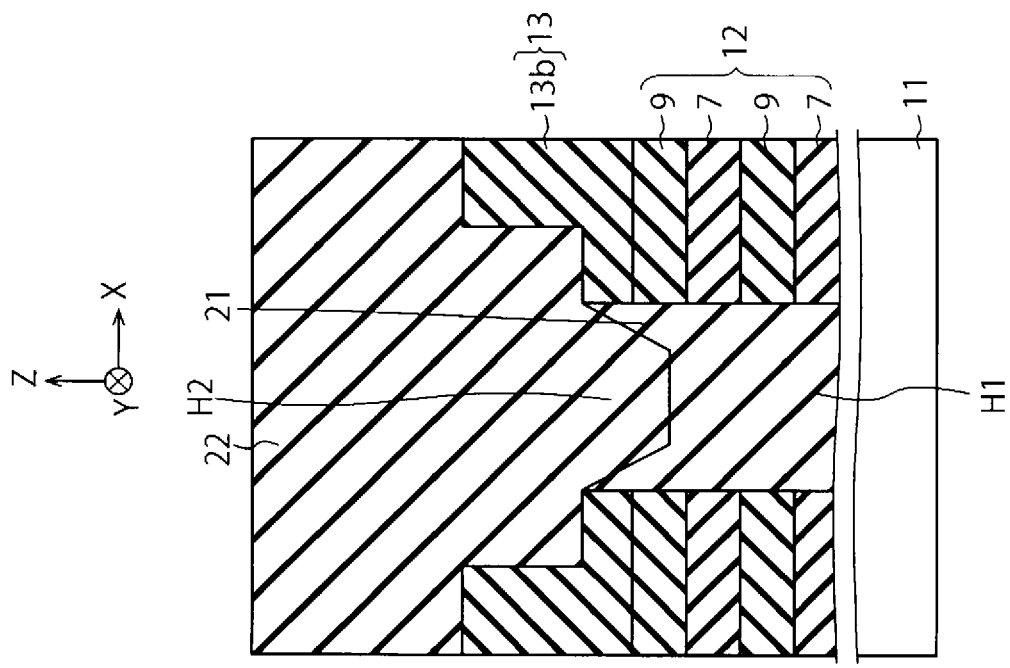
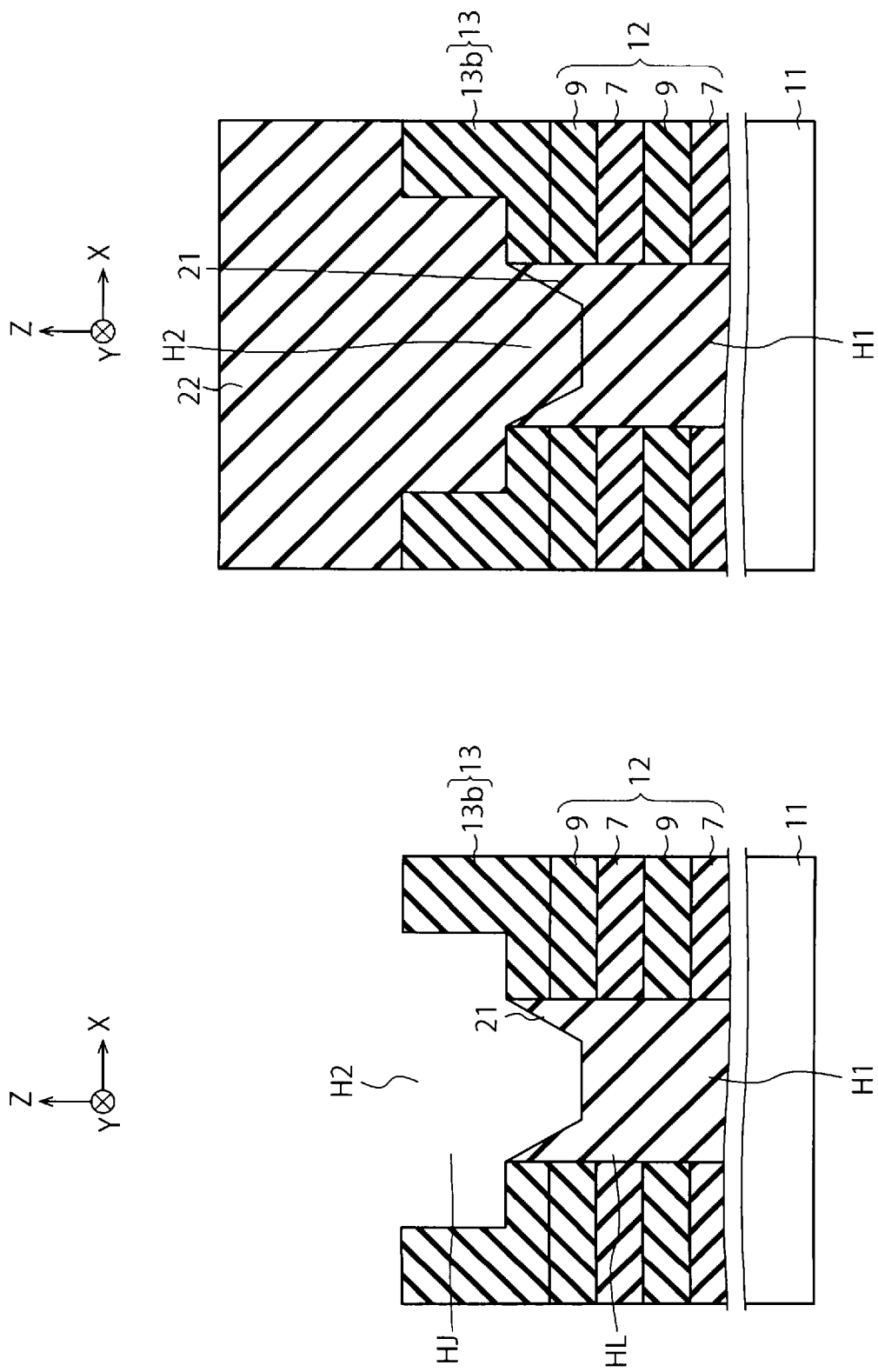

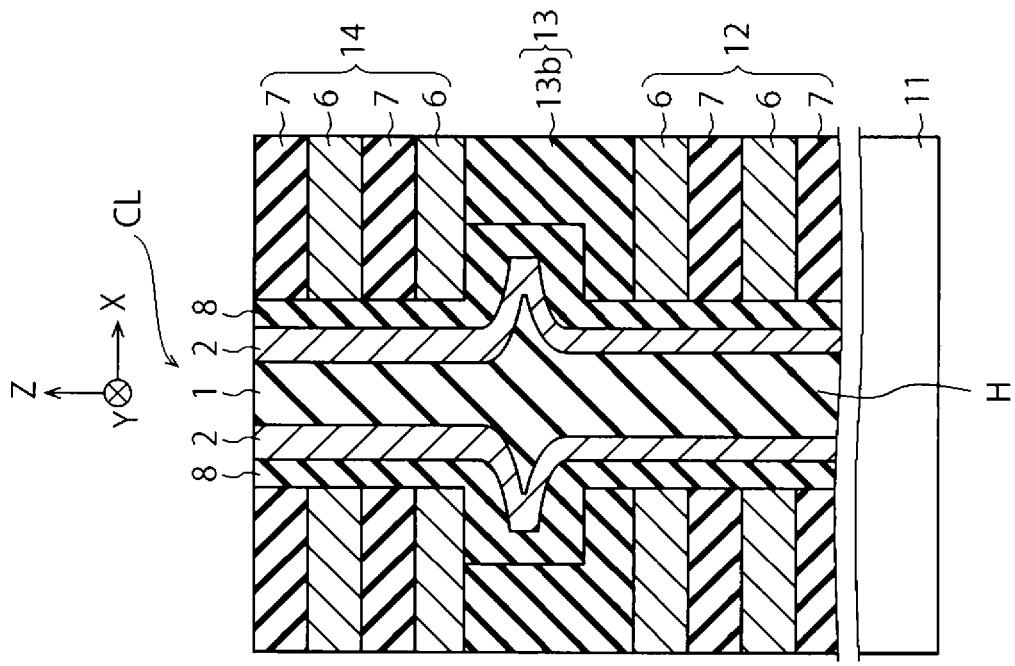
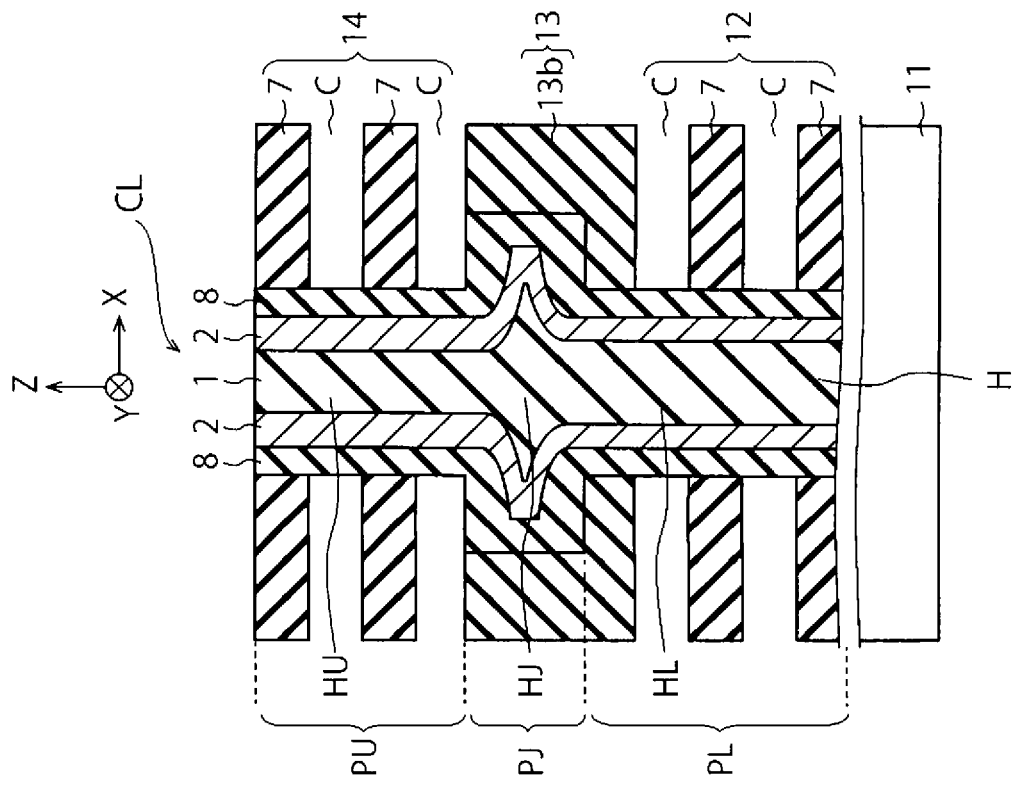

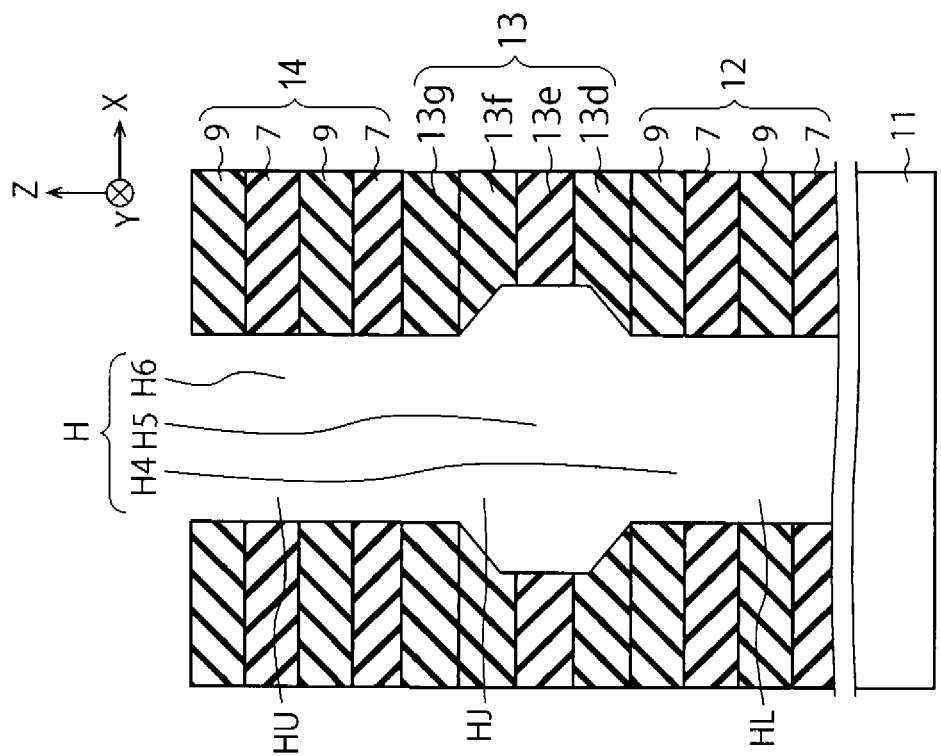
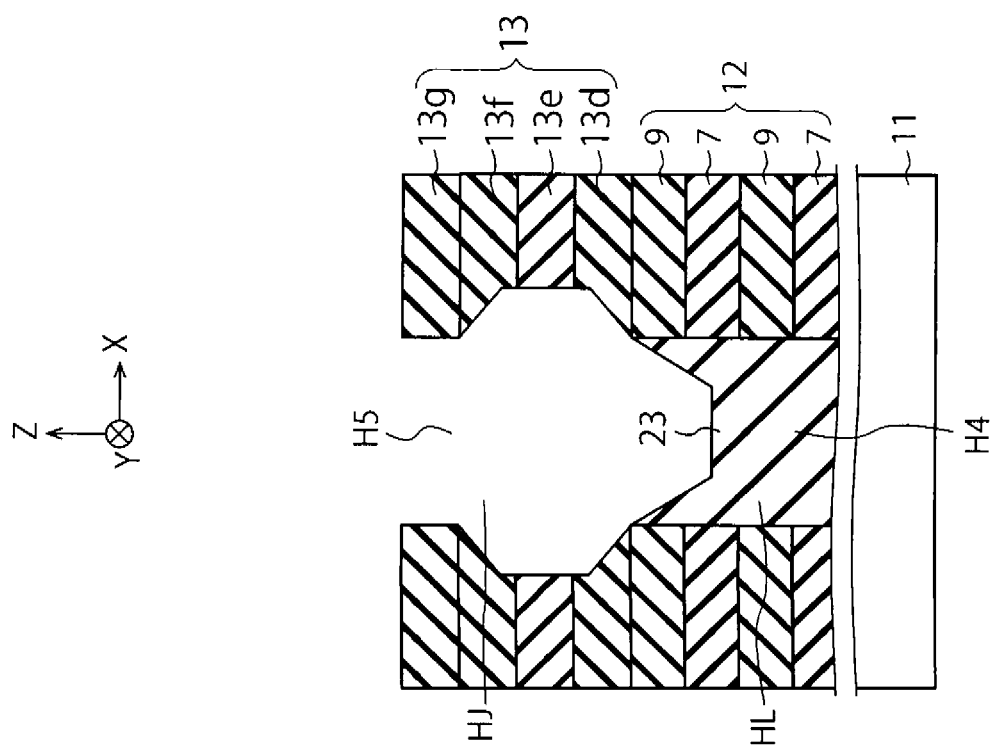

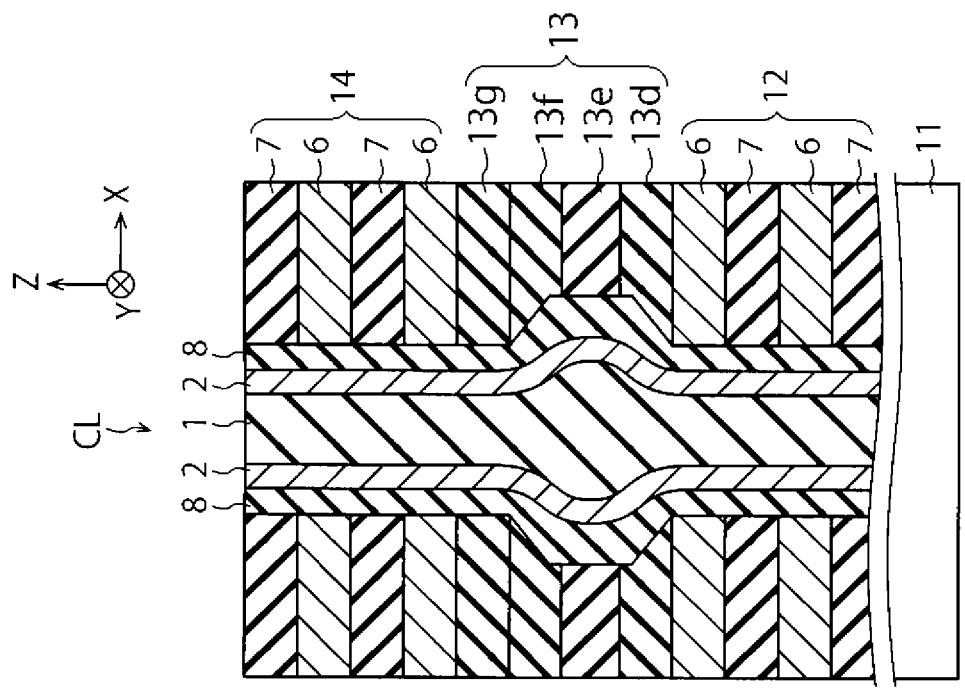
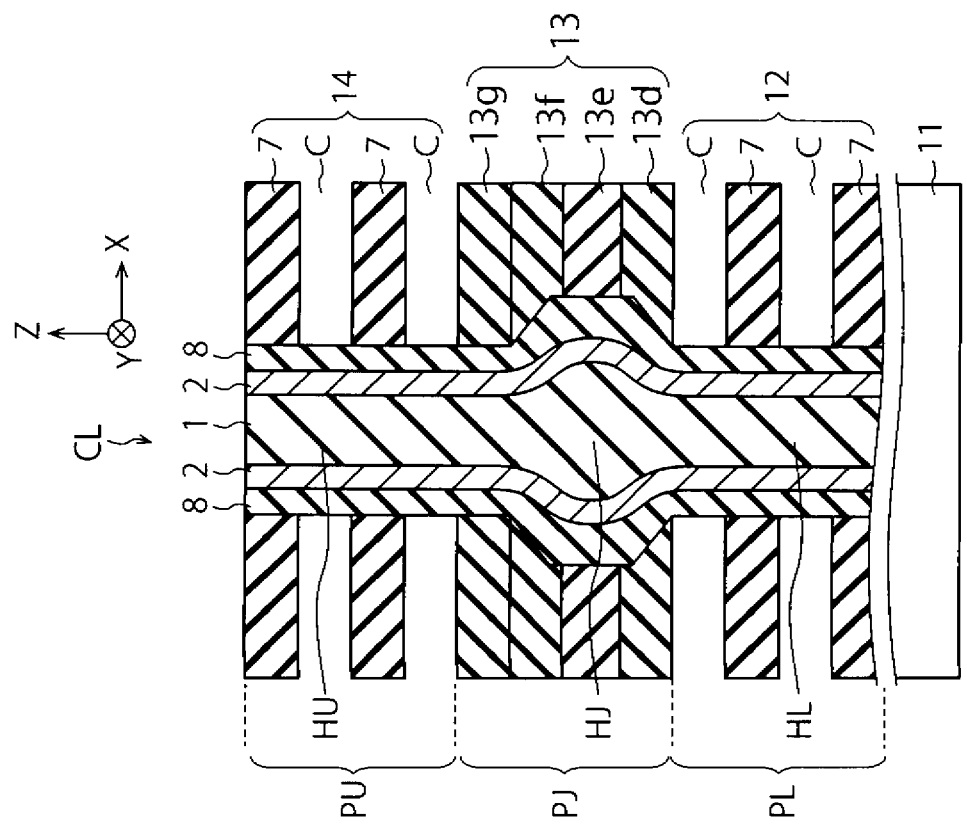

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2021-032083, filed Mar. 1, 2021, the entire contents of which are incorporated herein by reference.

FIELD

Embodiments described herein relate generally to a semiconductor device and a method for manufacturing the same.

BACKGROUND

In a three-dimensional memory device, a memory hole is typically formed to penetrate a lower stacked film, an intermediate film, and an upper stacked film. A channel semiconductor layer can further be formed in the memory hole. However, separating such a channel semiconductor layer in the intermediate film or the like may be challenging.

DESCRIPTION OF THE DRAWINGS

FIGS. 4A and 4B are cross-sectional views (1/5) illustrating a method for manufacturing the semiconductor device of the first embodiment;

FIGS. 6A and 6B are cross-sectional views (3/5) illustrating the method for manufacturing the semiconductor device of the first embodiment;

FIGS. 8A and 8B are cross-sectional views (5/5) illustrating the method for manufacturing the semiconductor device of the first embodiment;

FIGS. 9A and 9B are cross-sectional views (1/5) illustrating a method for manufacturing the semiconductor device of the comparative example of the first embodiment;

FIGS. 10A and 10B are cross-sectional views (2/5) illustrating the method for manufacturing the semiconductor device of the comparative example of the first embodiment;

FIGS. 11A and 11B are cross-sectional views (3/5) illustrating the method for manufacturing the semiconductor device of the comparative example of the first embodiment;

FIGS. 13A and 13B are cross-sectional views (5/5) illustrating the method for manufacturing the semiconductor device of the comparative example of the first embodiment;

FIGS. 19A and 19B are cross-sectional views (3/4) illustrating the method for manufacturing the semiconductor device of the second embodiment;

FIGS. 20A and 20B are cross-sectional views (4/4) illustrating the method for manufacturing the semiconductor device of the second embodiment;

DETAILED DESCRIPTION

Embodiments provide a semiconductor device capable of desirably forming a semiconductor layer in an opening, and a method for manufacturing the same.

In general, according to one embodiment, a semiconductor device includes: a first stacked film including a plurality of first electrode layers separated from each other; an insulating layer provided on the first stacked film; a second stacked film provided on the insulating layer and including a plurality of second electrode layers separated from each other; and a columnar portion including a first insulating film, a charge storage layer, a second insulating film, and a semiconductor layer, and extending along a first direction through the first stacked film, the insulating layer, and the second stacked film. The columnar portion extending in the insulating layer includes a first portion having a first width in a second direction intersecting the first direction, and a second portion provided at a different location along the first direction and having a second width in the second direction. The columnar portion extending in the second stacked film includes a third portion having a third width along the second direction. The second width is larger than the first width and the third width.

Hereinafter, embodiments of the present disclosure will be described with reference to the drawings. In FIGS. 1 to 23, the same configurations will be denoted by the same reference signs, and redundant description will be omitted.

First Embodiment

Figure 1:
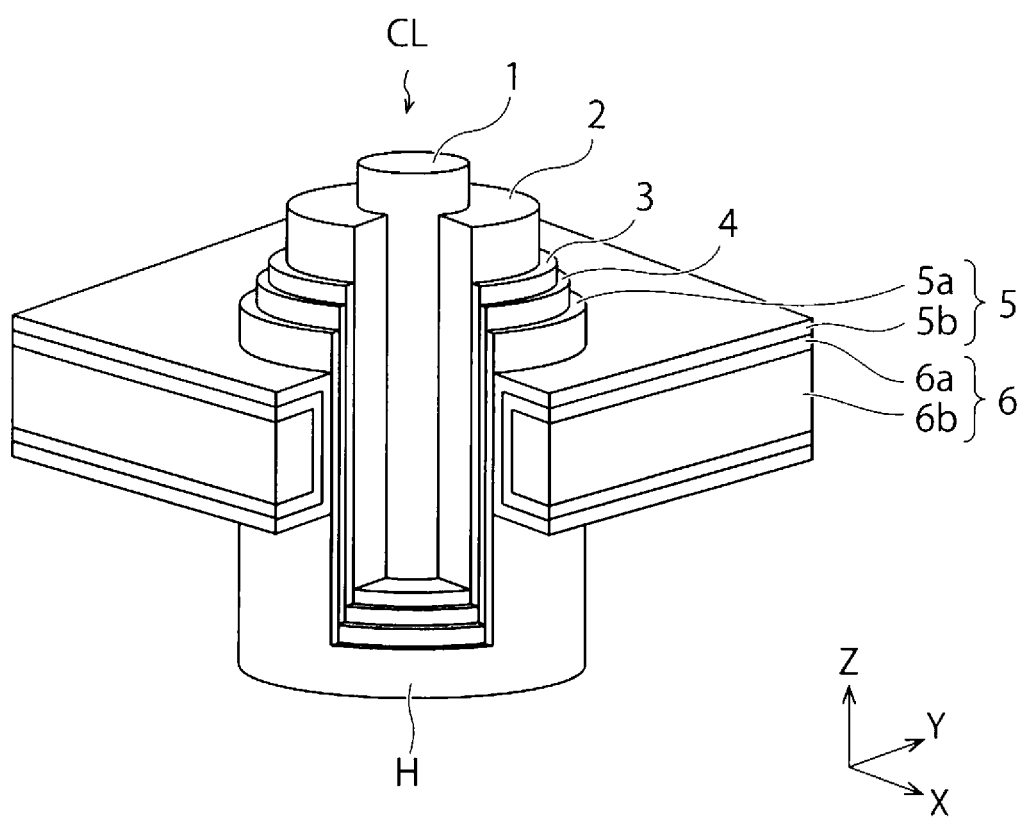
FIG. 1 is a perspective view illustrating a structure of a semiconductor device of a first embodiment.

FIG. 1 is a perspective view illustrating a structure of a semiconductor device of a first embodiment. The semiconductor device of FIG. 1 is, for example, a three-dimensional NAND memory.

The semiconductor device of FIG. 1 includes a core insulating film 1, a channel semiconductor layer 2, a tunnel insulating film 3, a charge storage layer 4, a block insulating film 5, and an electrode layer 6. The block insulating film 5 includes an insulating film 5a and an insulating film 5b. The electrode layer 6 includes a barrier metal layer 6a and an electrode material layer 6b. The insulating film 5a is an example of a first insulating film. The tunnel insulating film 3 is an example of a second insulating film.

In FIG. 1, a plurality of electrode layers and a plurality of insulating layers are alternately stacked on a substrate, and a memory hole H is provided in the electrode layers and insulating layers. FIG. 1 illustrates one electrode layer 6 of the electrode layers. For example, the electrode layers function as a word line of a NAND memory. FIG. 1 illustrates X and Y directions parallel to a surface of the substrate and perpendicular to each other, and a Z direction perpendicular to the surface of the substrate. In the specification, a +Z direction is referred to as an upward direction, and a −Z direction is referred to as a downward direction. The −Z direction may or may not coincide with a gravitational direction.

The core insulating film 1, the channel semiconductor layer 2, the tunnel insulating film 3, the charge storage layer 4, and the insulating film 5a are formed in the memory hole H, and form a memory cell of the NAND memory. The insulating film 5a is formed on surfaces of the electrode layer and the insulating layer in the memory hole H, and the charge storage layer 4 is formed on a surface of the insulating film 5a. The charge storage layer 4 can store charges between a side surface of an outer side thereof and a side surface of an inner side thereof. The tunnel insulating film 3 is formed on a surface of the charge storage layer 4, and the channel semiconductor layer 2 is formed on a surface of the tunnel insulating film 3. The channel semiconductor layer 2 functions as a channel of the memory cell. The core insulating film 1 is formed in the channel semiconductor layer 2.

The insulating film 5a is, for example, a silicon oxide film (an $SiO_2$ film). The charge storage layer 4 is, for example, a silicon nitride film (an SiN film). The tunnel insulating film 3 is, for example, the $SiO_2$ film, a silicon oxynitride film (an SiON film), or a stacked film including the $SiO_2$ film and the SiON film. The channel semiconductor layer 2 is, for example, a polysilicon layer. The core insulating film 1 is, for example, the $SiO_2$ film.

The insulating film 5b, the barrier metal layer 6a, and the electrode material layer 6b are formed between insulating layers adjacent to each other, and are formed in the order of a lower surface of an upper insulating layer, an upper surface of a lower insulating layer, and a side surface of the insulating film 5a. The insulating film 5b is, for example, a metal insulating film such as an aluminum oxide film (an $Al_2O_3$ film) or the like. The barrier metal layer 6a is, for example, a titanium nitride film (a TiN film). The electrode material layer 6b is, for example, a tungsten (W) layer.

FIG. 1 further illustrates a columnar portion CL provided in the memory hole H and extending in the Z direction. The columnar portion CL includes the insulating film 5a, the charge storage layer 4, the tunnel insulating film 3, the channel semiconductor layer 2, and the core insulating film 1 that are sequentially provided in the memory hole H. As illustrated in FIG. 1, the columnar portion CL has a columnar shape extending in the Z direction. The insulating film 5a, the charge storage layer 4, the tunnel insulating film 3, the channel semiconductor layer 2, and the core insulating film 1 in the columnar portion CL also have a columnar shape extending in the Z direction. It is noted that the insulating film 5a, the charge storage layer 4, the tunnel insulating film 3, and the channel semiconductor layer 2 have a tubular shape having an inner peripheral surface and an outer peripheral surface. On the other hand, while the core insulating film 1 has a non-tubular shape herein, the core insulating film 1 may have the tubular shape. Details of the columnar portion CL will be further described later.

Figure 2:
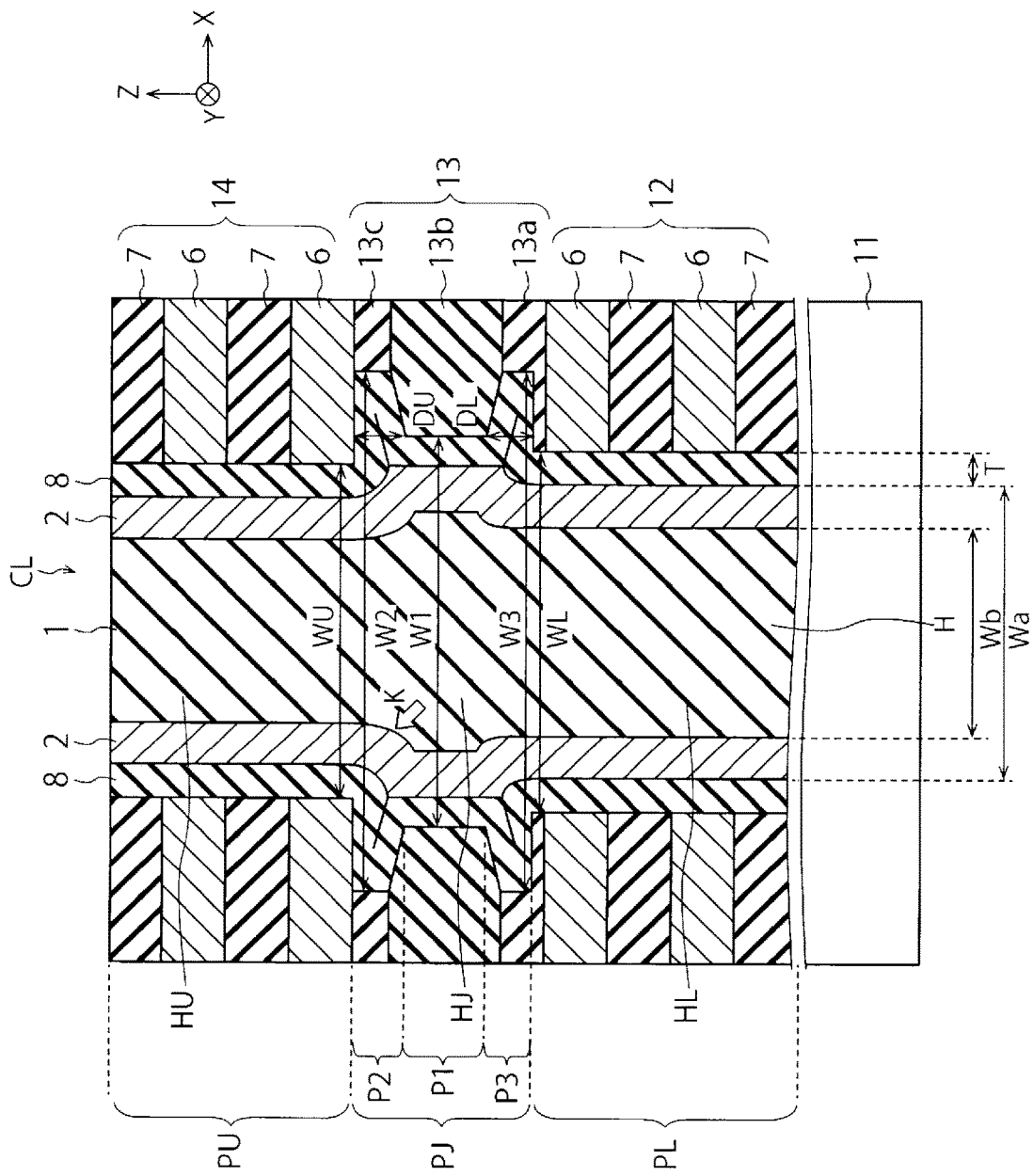
FIG. 2 is a cross-sectional view illustrating the structure of the semiconductor device of the first embodiment.

FIG. 2 is a cross-sectional view illustrating the structure of the semiconductor device of the first embodiment. FIG. 2 illustrates an XZ cross section of the above-described columnar portion CL or the like.

As illustrated in FIG. 2, the semiconductor device of the embodiment includes a substrate 11, a lower stacked film 12, an intermediate film 13, an upper stacked film 14, and the columnar portion CL. The lower stacked film 12 is an example of a first stacked film. The intermediate film 13 is an example of an insulating layer. The upper stacked film 14 is an example of a second stacked film.

The substrate 11 is the above-described substrate. The substrate 11 is, for example, a semiconductor substrate such as a silicon substrate or the like.

The lower stacked film 12 includes a plurality of electrode layers 6 and a plurality of insulating layers 7 alternately provided on the substrate 11. Therefore, the electrode layers 6 are separated from each other by the insulating layers 7. Each electrode layer 6 includes the barrier metal layer 6a and the electrode material layer 6b as described above. Each insulating layer 7 is, for example, the $SiO_2$ film. The illustration of the above-described insulating film 5b is omitted in FIG. 2. While the lower stacked film 12 includes two electrode layers 6 and two insulating layers 7 in FIG. 2, the lower stacked film 12 may include three or more electrode layers 6 and three or more insulating layers 7. The lower stacked film 12 may be formed directly on the substrate 11 or may be formed on the substrate 11 via another film. The electrode layer 6 in the lower stacked film 12 is an example of a first electrode layer.

The intermediate film 13 includes an insulating layer 13a, an insulating layer 13b, and an insulating layer 13c that are sequentially formed on the lower stacked film 12. The insulating layer 13a is, for example, the $SiO_2$ film. The insulating layer 13b is, for example, the SiON film. The insulating layer 13c is, for example, the $SiO_2$ film. As described above, the insulating layer 13b of the embodiment is formed of a material (SiON) different from a material ($SiO_2$) of the insulating layer 13a and a material ($SiO_2$) of the insulating layer 13c. The insulating layer 13b is an example of a first insulating layer. The insulating layer 13a is an example of a second insulating layer. The insulating layer 13c is an example of a third insulating layer.

The insulating layer 13b of the embodiment may have a density different from a density of the insulating layer 13a and a density of the insulating layer 13c. For example, the density of the insulating layer 13b may be higher than the density of the insulating layer 13a and the density of the insulating layer 13c. Here, the material of the insulating layer 13b may be the same as at least one of the material of the insulating layer 13a and the material of the insulating layer 13c, and may be different from at least one of the material of the insulating layer 13a and the material of the insulating layer 13c. Details of the insulating layers 13a, 13b, and 13c will be further described later.

The upper stacked film 14 includes a plurality of electrode layers 6 and a plurality of insulating layers 7 alternately provided on the intermediate film 13. Therefore, the electrode layers 6 are separated from each other by the insulating layers 7. In the same manner as that of the lower stacked film 12, each electrode layer 6 in the upper stacked film 14 includes the barrier metal layer 6a and the electrode material layer 6b, and each insulating layer 7 in the upper stacked film 14 is, for example, the $SiO_2$ film. The illustration of the above-described insulating film 5b is omitted in FIG. 2 in the upper stacked film 14 as well. While the upper stacked film 14 includes two electrode layers 6 and two insulating layers 7 in FIG. 2, the upper stacked film 14 may include three or more electrode layers 6 and three or more insulating layers 7. The electrode layer 6 in the lower stacked film 14 is an example of a second electrode layer.

The columnar portion CL is provided in the lower stacked film 12, the intermediate film 13, and the upper stacked film 14, and extends along a stacking direction of the lower stacked film 12, the intermediate film 13, and the upper stacked film 14, that is, in the Z direction. The columnar portion CL includes a memory insulating film 8, the channel semiconductor layer 2, and the core insulating film 1 that are sequentially provided in the lower stacked film 12, the intermediate film 13, and the upper stacked film 14. The memory insulating film 8 is a stacked film including the insulating film 5a, the charge storage layer 4, and the tunnel insulating film 3 in order. Therefore, in the columnar portion CL, the insulating film 5a, the charge storage layer 4, the tunnel insulating film 3, the channel semiconductor layer 2, and the core insulating film 1 are sequentially formed on side surfaces of the lower stacked film 12, the intermediate film 13, and the upper stacked film 14. The columnar portion CL of the embodiment is provided in the memory hole H penetrating the lower stacked film 12, the intermediate film 13, and the upper stacked film 14. The stacking direction is an example of a first direction from the first stacked film toward the second stacked film.

The memory hole H includes a lower memory hole HL, a joint hole HJ, and an upper memory hole HU. The joint hole HJ is provided between the lower memory hole HL and the upper memory hole HU, and connects the lower memory hole HL and the upper memory hole HU. The joint hole HJ of the embodiment protrudes in a radial direction with respect to side surfaces of the lower memory hole HL and the upper memory hole HU. The radial direction is an example of a second direction intersecting the first direction.

In the same manner, the columnar portion CL includes a lower columnar portion PL, a joint portion PJ, and an upper columnar portion PU. The joint portion PJ is provided between the lower columnar portion PL and the upper columnar portion PU, and connects the lower columnar portion PL and the upper columnar portion PU. The lower columnar portion PL, the joint portion PJ, and the upper columnar portion PU are respectively provided in the lower memory hole HL, the joint hole HJ, and the upper memory hole HU. Therefore, the joint portion PJ of the embodiment protrudes in the radial direction with respect to side surfaces of the lower columnar portion PL and the upper columnar portion PU.

In the embodiment, the lower columnar portion PL is provided in the lower stacked film 12, the joint portion PJ is provided in the intermediate film 13, and the upper columnar portion PU is provided in the upper stacked film 14. A part of the lower columnar portion PL is also provided in the intermediate film 13. The lower columnar portion PL and the upper columnar portion PU respectively form the memory cell of the NAND memory in the lower memory hole HL and the upper memory hole HU.

FIG. 2 illustrates a width WL in the X direction of the lower columnar portion PL and a width WU in the X direction of the upper columnar portion PU. Specifically, the width WL indicates a width near an upper end of the lower columnar portion PL, and the width WU indicates a width near a lower end of the upper columnar portion PL. The columnar portion CL of the embodiment has an approximately circular cross-sectional shape in any XY cross section. Therefore, the width WL and the width WU of the embodiment are diameters of the lower columnar portion PL and the upper columnar portion PU, respectively. The same also applies to widths W1, W2, W3, Wa, and Wb which will be described later.

Hereinafter, continuously, details of the joint portion PJ of the embodiment will be further described with reference to FIG. 2.

The joint portion PJ includes an intermediate joint portion P1, an upper joint portion P2, and a lower joint portion P3. The upper joint portion P2 is provided at a location higher than that of the intermediate joint portion P1, and the lower joint portion P3 is provided at a location lower than that of the intermediate joint portion P1. In the embodiment, the upper joint portion P2 and the lower joint portion P3 protrude in the radial direction with respect to a side surface of the intermediate joint portion P1. The intermediate joint portion P1, the upper joint portion P2, and the lower joint portion P3 are examples of a first portion, a second portion, and a third portion, respectively.

In the embodiment, the intermediate joint portion P1 is provided in the insulating layer 13b, the upper joint portion P2 is provided in the insulating layer 13c, and the lower joint portion P3 is provided in the insulating layer 13a. A part of the upper joint portion P2 and a part of the lower joint portion P3 are also provided in the insulating layer 13b. In the embodiment, a lower surface of the memory insulating film 8 in the upper joint portion P2 is in contact with an upper surface of the insulating layer 13b, and the lower surface thereof and the upper surface thereof are inclined in the Z direction. In the same manner, an upper surface of the memory insulating film 8 in the lower joint portion P3 is in contact with a lower surface of the insulating layer 13b, and the upper surface thereof and the lower surface thereof are inclined in the Z direction.

FIG. 2 illustrates the width W1 in the X direction of the intermediate joint portion P1, the width W2 in the X direction of the upper joint portion P2, and the width W3 in the X direction of the lower joint portion P3. Specifically, the width W2 indicates a width near an upper end of the upper joint portion P2, and the width W3 indicates a width near a lower end of the lower joint portion P3. As described above, the joint portion PJ of the embodiment protrudes in the radial direction with respect to the side surfaces of the lower columnar portion PL and the upper columnar portion PU. Therefore, the widths W1, W2, and W3 of the embodiment are larger than the widths WL and WU (W1, W2, and W3>WL and WU). The upper joint portion P2 and the lower joint portion P3 of the embodiment protrude in the radial direction with respect to the side surface of the intermediate joint portion P1. Therefore, the widths W2 and W3 of the embodiment are larger than the width W1 (W2 and W3>W1). The widths W1, W2, and W3 are examples of a first width, a second width, and a third width, respectively.

A difference between the width W1 and the widths W2 and W3 of the embodiment is caused by, for example, a difference between an etching ratio of the insulating layer 13b and etching ratios of the insulating layers 13c and 13a. Details of the etching ratios will be described later.

FIG. 2 further illustrates a thickness DU in the Z direction of the upper joint portion P2, a thickness DL in the Z direction of the lower joint portion P3, and a film thickness T of the memory insulating film 8. Specifically, the thickness DU indicates a thickness of the upper joint portion P2 above the side surface of the intermediate joint portion P1, and the thickness DL indicates a thickness of the lower joint portion P3 below the side surface of the intermediate joint portion P1. The film thickness T indicates a total film thickness of the insulating film 5a, the charge storage layer 4, and the tunnel insulating film 3. In the embodiment, the thickness DU and the thickness DL are set to be twice or less the film thickness T (DU and DL≤2T).

In the embodiment, since the width W2 and the width W3 are larger than the width W1, a side surface of the joint hole HJ protrudes in the radial direction near an upper end and a lower end of the joint hole HJ. That is, the joint hole HJ includes two protruding portions near the upper end and the lower end of the joint hole HJ. Therefore, the memory insulating film 8 of the upper joint portion P2 and the memory insulating film 8 of the lower joint portion P3 enter into these protruding portions. As illustrated in FIG. 2, two memory insulating films 8 enter into each protruding portion. In the embodiment, since the thickness DU of the upper joint portion P2 and the thickness DL of the lower joint portion P3 are set to be twice or less the film thickness T of the memory insulating film 8, each protruding portion is filled with the memory insulating film 8. As described above, according to the embodiment, the thickness DU (or the thickness DL) is set to be twice or less the film thickness T, such that the protruding portion near the upper end (or near the lower end) of the joint hole HJ can be filled with the memory insulating film 8.

FIG. 2 further illustrates the width Wa of the outer peripheral surface of the channel semiconductor layer 2 and the width Wb of the inner peripheral surface of the channel semiconductor layer 2. As described above, the joint portion PJ of the embodiment protrudes in the radial direction with respect to the side surfaces of the lower columnar portion PL and the upper columnar portion PU. Therefore, the widths Wa and Wb of the embodiment have larger values in the joint portion PJ than those in the lower columnar portion PL and the upper columnar portion PU. The same also applies to a width of an outer peripheral surface of the memory insulating film 8 and a width of an inner peripheral surface thereof.

It is noted that the width of the outer peripheral surface of the memory insulating film 8 becomes maximum in the upper joint portion P2 or the lower joint portion P3 of the intermediate joint portion P1, the upper joint portion P2, and the lower joint portion P3. The reason is that the protruding portion exists near the upper end and the lower end of the joint hole HJ, and the memory insulating film 8 enters into the protruding portion. On the other hand, the width Wa of the outer peripheral surface of the channel semiconductor layer 2 and the width Wb of the inner peripheral surface thereof become maximum in the intermediate joint portion P1 of the intermediate joint portion P1, the upper joint portion P2, and the lower joint portion P3. The reason is that the protruding portion is filled with the memory insulating film 8, and the channel semiconductor layer 2 does not enter into the protruding portion. As described above, according to the embodiment, the width Wa of the outer peripheral surface of the channel semiconductor layer 2 and the width Wb of the inner peripheral surface thereof can be made maximum in the intermediate joint portion P1.

Figure 3:
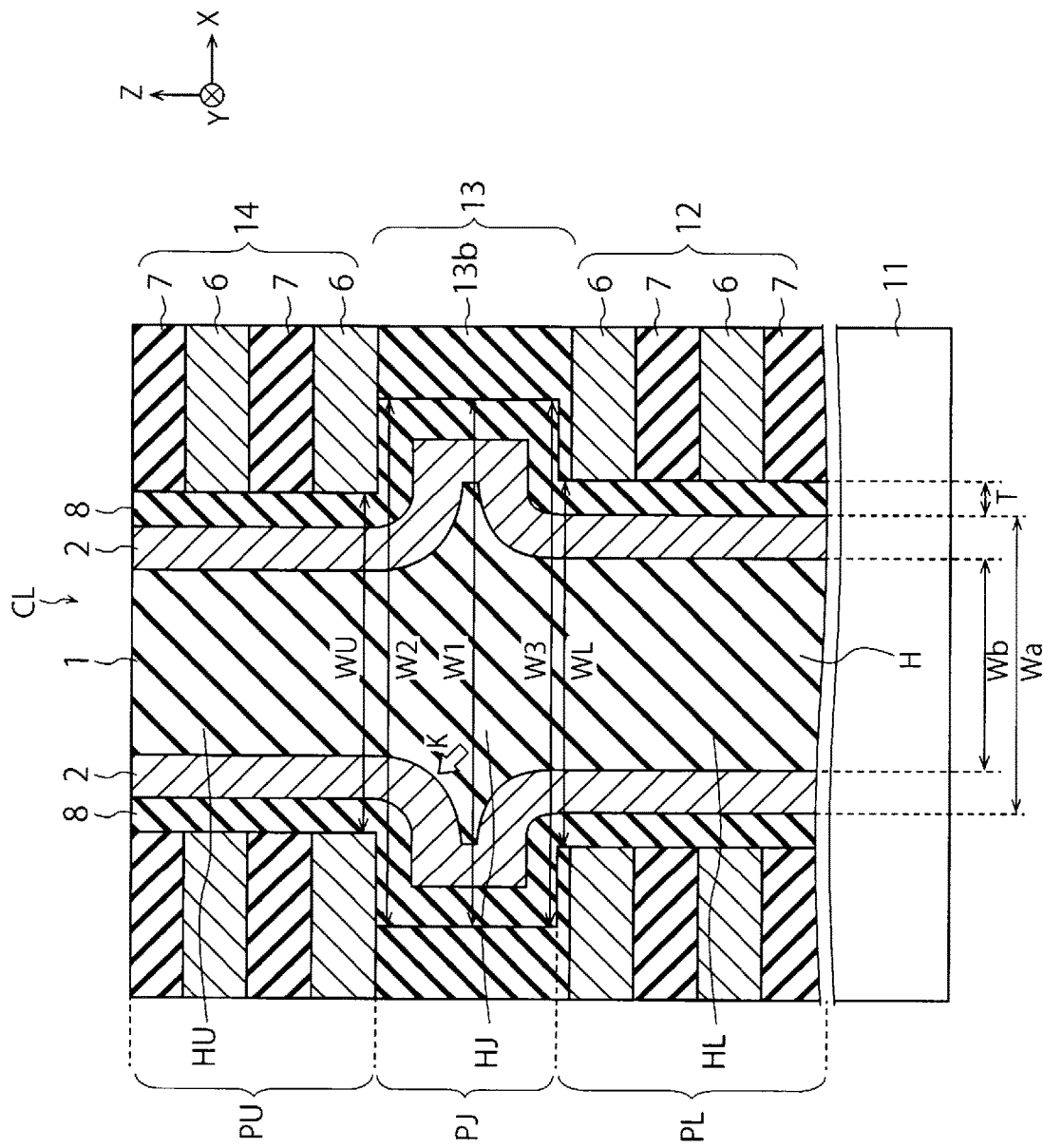
FIG. 3 is a cross-sectional view illustrating a structure of a semiconductor device of a comparative example of the first embodiment.

FIG. 3 is a cross-sectional view illustrating a structure of a semiconductor device of a comparative example of the first embodiment.

The semiconductor device of the comparative example illustrated in FIG. 3 has the same structure as that of the semiconductor device of the first embodiment illustrated in FIG. 2. It is noted that the joint portion PJ of the columnar portion CL of the comparative example forms a uniform width (a diameter) from a lower end of the joint portion PJ to an upper end thereof. In the comparative example, the width W1 of a central portion of the joint portion PJ is the same as the width W2 near the upper end of the joint portion PJ and the width W3 near the lower end of the joint portion PJ (W1=W2=W3).

FIG. 3 illustrates a corner portion K of the channel semiconductor layer 2 near a boundary between the joint portion PJ and the upper columnar portion PU. Near the boundary therebetween, since a width of the columnar portion CL significantly changes from the width WU to the width W1, a shape of the channel semiconductor layer 2 is significantly curved near the corner portion K. As a result, the channel semiconductor layer 2 may be divided near the corner portion K. When the integration of semiconductor devices progresses and the film thickness of the channel semiconductor layer 2 becomes thinner, such division becomes more likely to occur.

Such division may also occur at a corner portion of the channel semiconductor layer 2 near a boundary between the joint portion PJ and the lower columnar portion PL. It is noted that, since the width WU near a lower end of the upper columnar portion PU is often smaller than the width WL near the upper end of the lower columnar portion PL (WU<WL), such division is more likely to occur at the corner portion K of the channel semiconductor layer 2 near the boundary between the joint portion PJ and the upper columnar portion PU.

FIG. 2 also illustrates the corner portion K of the channel semiconductor layer 2 near the boundary between the joint portion PJ and the upper columnar portion PU. It is noted that a curvature of the channel semiconductor layer 2 at the corner portion K illustrated in FIG. 2 is gentler than a curvature of the channel semiconductor layer 2 at the corner portion K illustrated in FIG. 3. The reason is that the memory insulating film 8 enters into the protruding portion of the joint hole HJ, such that the widths Wa and Wb of the channel semiconductor layer 2 do not significantly change near the corner portion K. As a result, the channel semiconductor layer 2 is prevented from being divided near the corner portion K. As described above, according to the embodiment, the intermediate joint portion P1 and the upper joint portion P2 are provided in the joint portion PJ, such that the channel semiconductor layer 2 can be prevented from being divided near the corner portion K. According to the embodiment, the lower joint portion P3 is further provided in the joint portion PJ, such that the channel semiconductor layer 2 can be prevented from being divided at the corner portion near the boundary between the joint portion PJ and the lower columnar portion PL.

Such effects are further improved by setting the thickness DU and the thickness DL to be twice or less the film thickness T. The reason is that the protruding portion of the joint hole HJ can be filled with the memory insulating film 8 by the above-described setting of the thickness DU and the thickness DL, such that the curvature of the channel semiconductor layer 2 can be made more gently. Since the width WU near the lower end of the upper columnar portion PU is often smaller than the width WL near the upper end of the lower columnar portion PL (WU<WL), in many cases, a merit of setting the thickness DU to be twice or less the film thickness T is greater than a merit of setting the thickness DL to be twice or less the film thickness T.

FIGS. 4 to 8 are cross-sectional views illustrating a method for manufacturing the semiconductor device of the first embodiment.

First, the lower stacked film 12 and the intermediate film 13 are sequentially formed on the substrate 11 (FIG. 4A). It is noted that the lower stacked film 12 illustrated in FIG. 4A is formed by alternately stacking a plurality of sacrifice layers 9 and a plurality of insulating layers 7 on the substrate 11, which is different from the lower stacked film 12 illustrated in FIG. 2. The sacrifice layers 9 are replaced with a plurality of electrode layers 6 in a process which will be described later. On the other hand, the intermediate film 13 illustrated in FIG. 4A is formed by sequentially stacking the insulating layer 13a, the insulating layer 13b, and the insulating layer 13c on the lower stacked film 12, in the same manner as that of the intermediate film 13 illustrated in FIG. 2. The sacrifice layer 9 is, for example, the SiN film. In FIG. 4A, the sacrifice layers 9 are separated from each other by the insulating layer 7. The sacrifice layer 9 is an example of a first layer.

Next, a hole H1 penetrating the intermediate film 13 and the lower stacked film 12 is formed by etching (FIG. 4B). The hole H1 becomes a part of the memory hole H as described later.

Figure 5B:
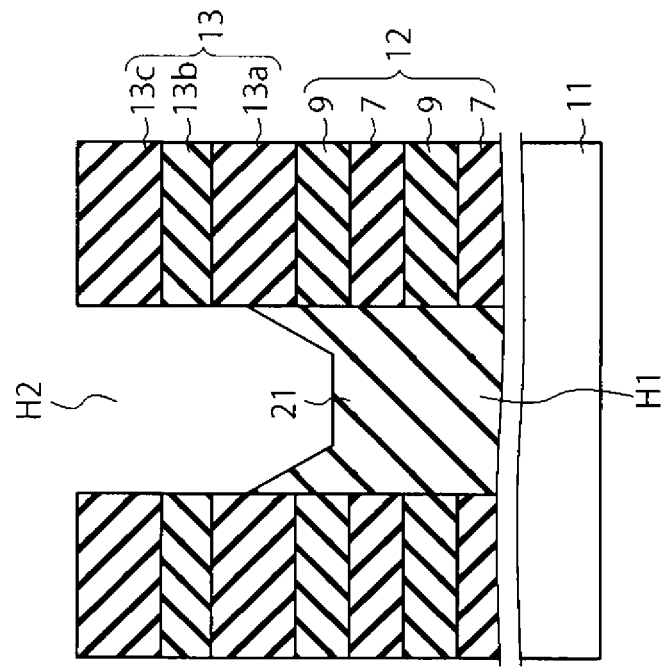
FIGS. 5A and 5B are cross-sectional views (2/5) illustrating the method for manufacturing the semiconductor device of the first embodiment.
Figure 5A:
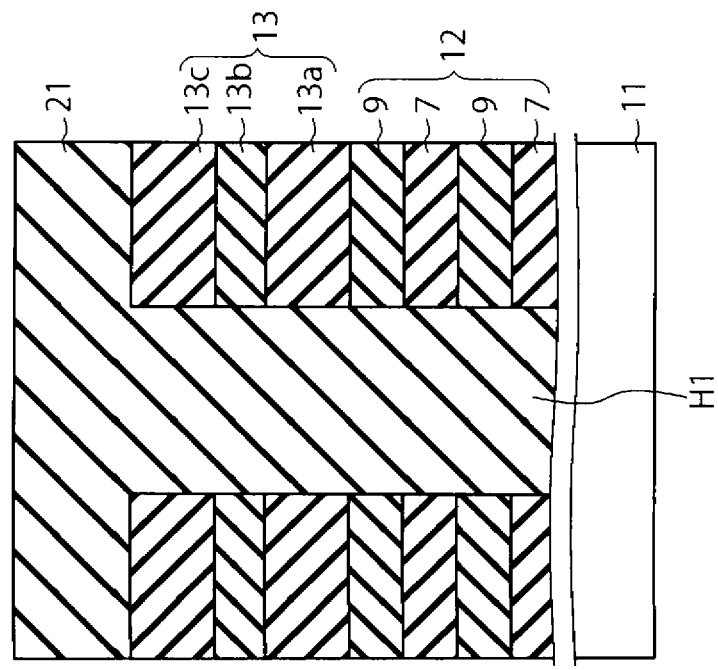

Next, a resist film 21 is formed on the whole surface of the substrate 11 (FIG. 5A). As a result, an upper surface of the intermediate film 13 is covered with the resist film 21, and the hole H1 is filled with the resist film 21.

Next, a part of the resist film 21 is removed by etching (FIG. 5B). As a result, the resist film 21 is removed from the upper surface of the intermediate film 13, and a part of the resist film 21 in the hole H1 is removed. A hole H2 illustrated in FIG. 5B is an area where the resist film 21 is removed from the hole H1. The hole H2 is formed so that aside surface of the insulating layer 13c, a side surface of the insulating layer 13b, and apart of a side surface of the insulating layer 13a are exposed.

Next, the intermediate film 13 is processed by etching (FIG. 6A). In the embodiment, the insulating layers 13a and 13c are, for example, the SiO$_2$ film, and the insulating layer 13b is, for example, the SiON film. Therefore, the insulating layer 13b is processed at an etching ratio different from etching ratios of the insulating layers 13a and 13c. In the embodiment, the etching ratio of the insulating layer 13b is decreased, and the etching ratios of the insulating layers 13a and 13c is increased. As a result, the side surfaces of the insulating layers 13a and 13c are etched faster than the side surface of the insulating layer 13b, and the hole H2 changes to the above-described joint hole HJ. On the other hand, the hole H1 other than the hole H2 becomes the above-described lower memory hole HL.

The insulating layer 13b of the embodiment is formed of the same material as the material of the insulating layer 13a and the material of the insulating layer 13c, and may have a density different from the density of the insulating layer 13a and the density of the insulating layer 13c. For example, the density of the insulating layer 13b may be higher than the density of the insulating layer 13a and the density of the insulating layer 13c. Accordingly, even though the materials of the insulating layers 13a, 13b and 13c are the same, the etching ratio of the insulating layer 13b can be reduced and the etching ratios of the insulating layers 13a and 13c can be increased.

Next, a resist film 22 is formed on the whole surface of the substrate 11 (FIG. 6B). As a result, the upper surface of the intermediate film 13 is covered with the resist film 22, and the hole H2 is filled with the resist film 22.

Figure 7B:
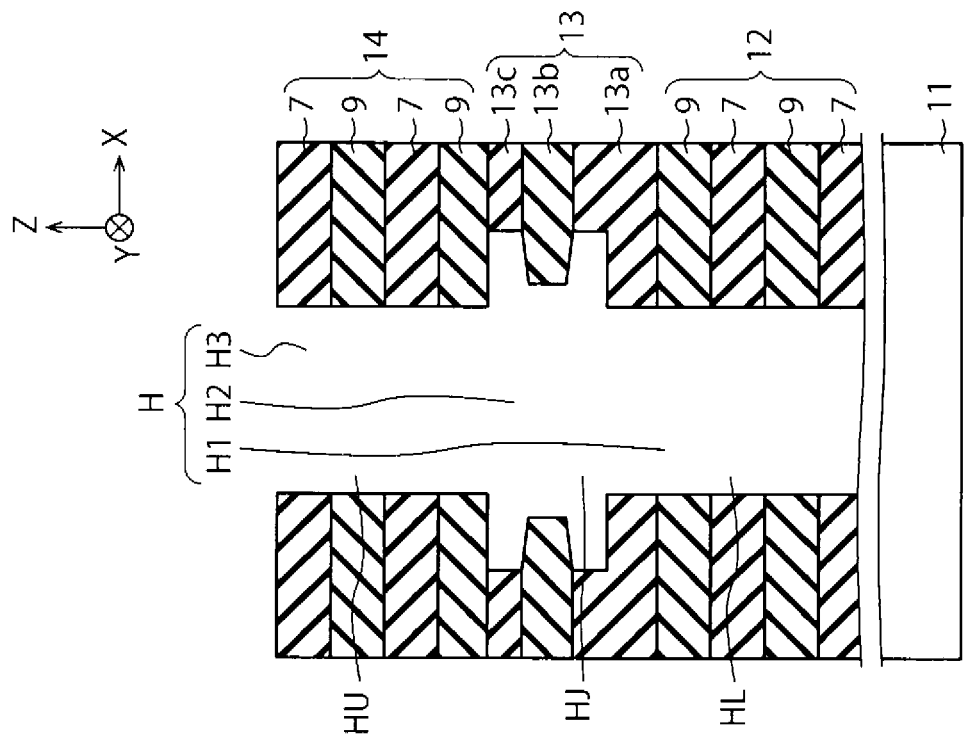
FIGS. 7A and 7B are cross-sectional views (4/5) illustrating the method for manufacturing the semiconductor device of the first embodiment.
Figure 7A:
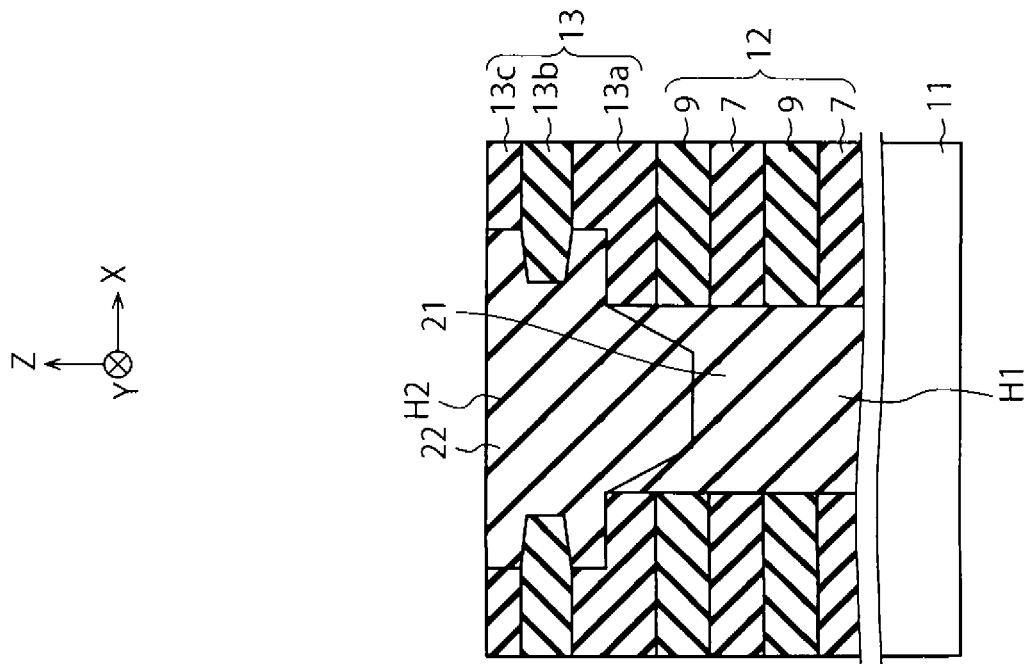

Next, the resist film 22 is removed from the upper surface of the intermediate film 13 (FIG. 7A). As a result, the upper surface of the intermediate film 13 is exposed from the resist film 22.

Next, the upper stacked film 14 is formed on the intermediate film 13 and the resist film 22, a hole H3 penetrating the upper stacked film 14 is formed by etching, and then the resist films 22 and 21 are removed (FIG. 7B). It is noted that, in a different manner as that of the upper stacked film 14 illustrated in FIG. 2, the upper stacked film 14 illustrated in FIG. 7B is formed by alternately stacking a plurality of sacrifice layers 9 and a plurality of insulating layers 7 on the intermediate film 13. The sacrifice layers 9 are replaced with a plurality of electrode layers 6 in a process which will be described later. The sacrifice layer 9 of the upper stacked film 14 is, for example, the SiN film, in the same manner as that of the sacrifice layer 9 of the lower stacked film 12. In FIG. 7B, the sacrifice layers 9 of the upper stacked film 14 are separated from each other by the insulating layer 7 of the upper stacked film 14. The sacrifice layer 9 of the upper stacked film 14 is an example of a second layer.

The hole H3 illustrated in FIG. 7B is formed on the hole H2 and becomes the above-described upper memory hole HU. As such, the memory hole H including the lower memory hole HL, the joint hole HJ, and the upper memory hole HU is formed in the lower stacked film 12, the intermediate film 13, and the upper stacked film 14. The memory hole H is an example of an opening.

Next, the memory insulating film 8, the channel semiconductor layer 2, and the core insulating film 1 are sequentially formed in the memory hole H, and then the sacrifice layer 9 of the lower stacked film 12 and the sacrifice layer 9 of the upper stacked film 14 are removed by etching (FIG. 8A). As a result, the columnar portion CL is formed in the memory hole H. The columnar portion CL is formed to include the insulating film 5a, the charge storage layer 4, the tunnel insulating film 3, the channel semiconductor layer 2, and the core insulating film 1 that are sequentially formed on a side surface of the memory hole H and a bottom surface thereof. The sacrifice layer 9 is removed from slits formed in the upper stacked film 14, the intermediate film 13, and the lower stacked film 12. As a result, a recess portion C is formed in an area where the sacrifice layer 9 is removed.

FIG. 8A illustrates the lower columnar portion PL formed in the lower memory hole HL, the joint portion PJ formed in the joint hole HJ, and the upper columnar portion PU formed in the upper memory hole HU. As such, the columnar portion CL including the lower columnar portion PL, the joint portion PJ, and the upper columnar portion PU is formed in the lower stacked film 12, the intermediate film 13, and the upper stacked film 14. In FIG. 8A, the protruding portion in the joint hole HJ is filled with the memory insulating film 8.

Next, the electrode layer 6 is formed in each recess portion C (FIG. 8B). As a result, the lower stacked film 12 and the upper stacked film 14 including the electrode layer 6 are formed on the substrate 11. In the embodiment, the insulating film 5b, the barrier metal layer 6a, and the electrode material layer 6b are sequentially formed on the surfaces of the insulating layer 7, the insulating layer 13, and the memory insulating film 8 in each recess portion C. As such, the insulating film 5b, the barrier metal layer 6a, and the electrode material layer 6b having the structure illustrated in FIG. 1 are formed. The illustration of the insulating film 5b is omitted in FIG. 8B.

As such, the semiconductor device illustrated in FIG. 2 is manufactured. When the electrode layer 6 is formed instead of the sacrifice layer 7 in the processes of FIGS. 4A and 7B, the sacrifice layer 7 is not necessarily replaced with the electrode layer 6 in the processes of FIGS. 8A and 8B. The electrode layer 6 here is an example of the first layer and the second layer.

FIGS. 9 to 13 are cross-sectional views illustrating a method for manufacturing the semiconductor device of the comparative example of the first embodiment. In the description of the method for manufacturing the semiconductor device of the comparative example, the description of a common point with the method for manufacturing the semiconductor device of the first embodiment will be appropriately omitted.

First, the lower stacked film 12 and the intermediate film 13 are sequentially formed on the substrate 11 (FIG. 9A). The lower stacked film 12 is formed by alternately stacking a plurality of sacrifice layers 9 and a plurality of insulating layers 7 on the substrate 11. The intermediate film 13 is formed by forming the insulating layer 13b on the lower stacked film 12. Next, the hole H1 penetrating the intermediate film 13 and the lower stacked film 12 is formed by etching (FIG. 9B).

Next, the resist film 21 is formed on the whole surface of the substrate 11 (FIG. 10A). As a result, the hole H1 is filled with the resist film 21. Next, a part of the resist film 21 is removed by etching (FIG. 10B). As a result, apart of the resist film 21 in the hole H1 is removed. The hole H2 illustrated in FIG. 10B is an area where the resist film 21 is removed from the hole H1. The hole H2 is formed so that apart of the side surface of the insulating layer 13b is exposed.

Next, the intermediate film 13 is processed by etching (FIG. 11A). As a result, the hole H2 changes to the above-described joint hole HJ. On the other hand, the hole H1 other than the hole H2 becomes the above-described lower memory hole HL. Next, the resist film 22 is formed on the whole surface of the substrate 11 (FIG. 11B). As a result, the hole H2 is filled with the resist film 22.

Figure 12A:
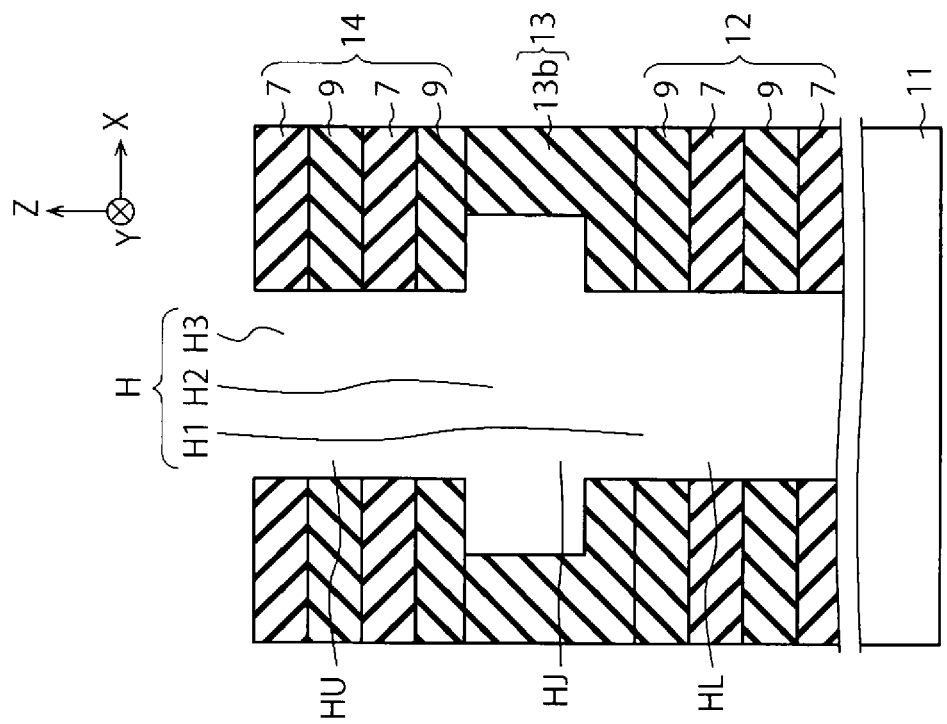
FIGS. 12A and 12B are cross-sectional views (4/5) illustrating the method for manufacturing the semiconductor device of the comparative example of the first embodiment.
Figure 12B:
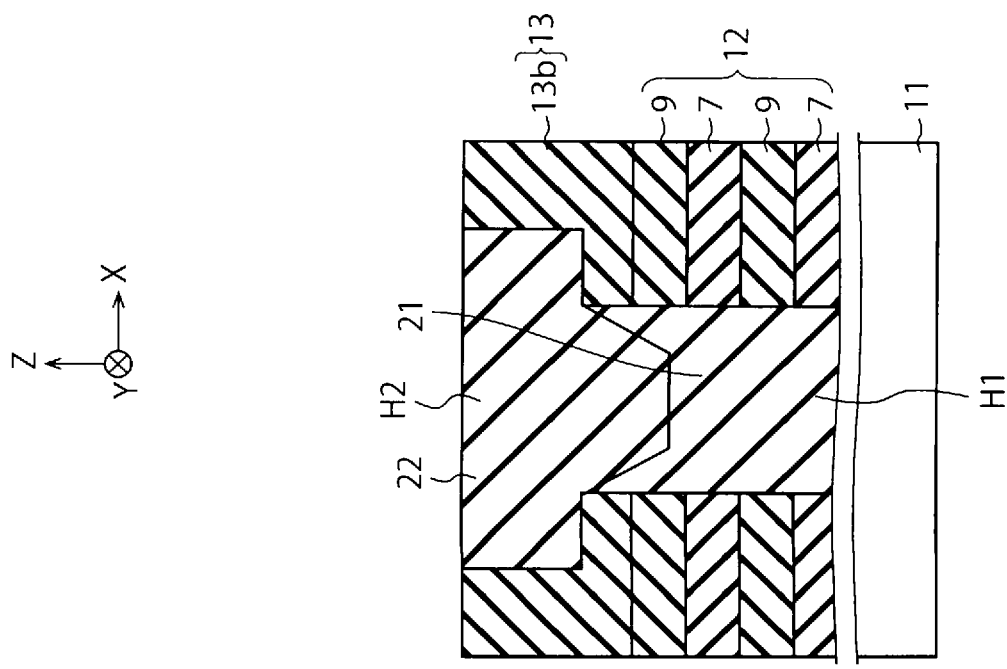

Next, the resist film 22 is removed from the upper surface of the intermediate film 13 (FIG. 12A). As a result, the upper surface of the intermediate film 13 is exposed from the resist film 22. Next, the upper stacked film 14 is formed on the intermediate film 13 and the resist film 22, the hole H3 penetrating the upper stacked film 14 is formed by etching, and then the resist films 22 and 21 are removed (FIG. 12B). The upper stacked film 14 is formed by alternately stacking a plurality of sacrifice layers 9 and a plurality of insulating layers 7 on the intermediate film 13.

The hole H3 illustrated in FIG. 12B is formed on the hole H2 and becomes the above-described upper memory hole HU. As such, the memory hole H including the lower memory hole HL, the joint hole HJ, and the upper memory hole HU is formed in the lower stacked film 12, the intermediate film 13, and the upper stacked film 14.

Next, the memory insulating film 8, the channel semiconductor layer 2, and the core insulating film 1 are sequentially formed in the memory hole H, and then the sacrifice layer 9 of the lower stacked film 12 and the sacrifice layer 9 of the upper stacked film 14 are removed by etching (FIG. 13A). As a result, the columnar portion CL is formed in the memory hole H. The sacrifice layer 9 is removed from the slits formed in the upper stacked film 14, the intermediate film 13, and the lower stacked film 12. As a result, the recess portion C is formed in an area where the sacrifice layer 9 is removed.

FIG. 13A illustrates the lower columnar portion PL formed in the lower memory hole HL, the joint portion PJ formed in the joint hole HJ, and the upper columnar portion PU formed in the upper memory hole HU. As such, the columnar portion CL including the lower columnar portion PL, the joint portion PJ, and the upper columnar portion PU is formed in the lower stacked film 12, the intermediate film 13, and the upper stacked film 14.

Next, the electrode layer 6 is formed in each recess portion C (FIG. 13B). As a result, the lower stacked film 12 and the upper stacked film 14 including the electrode layer 6 are formed on the substrate 11. As such, the semiconductor device illustrated in FIG. 3 is manufactured.

In the method for manufacturing the semiconductor device of the comparative example, the intermediate film 13 is formed to include only the insulating layer 13b (FIG. 9A). Therefore, the joint hole HJ of the comparative example is formed to have a uniform width (a diameter) from the lower end of the joint hole HJ to the upper end thereof (FIG. 11A). Therefore, the shape of the channel semiconductor layer 2 is significantly curved near the boundary between the joint portion PJ and the upper columnar portion PU (FIG. 13A). As a result, the channel semiconductor layer 2 may be divided near the corner portion.

On the other hand, in the method for manufacturing the semiconductor device of the first embodiment, the intermediate film 13 is formed to include the insulating layers 13a, 13b, and 13c in order (FIG. 4A). Therefore, the joint hole HJ of the embodiment is formed to include the protruding portion (FIG. 6A). As a result, the shape of the channel semiconductor layer 2 is prevented from being significantly curved near the boundary between the joint portion PJ and the upper columnar portion PU (FIG. 8A). Accordingly, the channel semiconductor layer 2 can be prevented from being divided near the corner portion.

Figure 21:
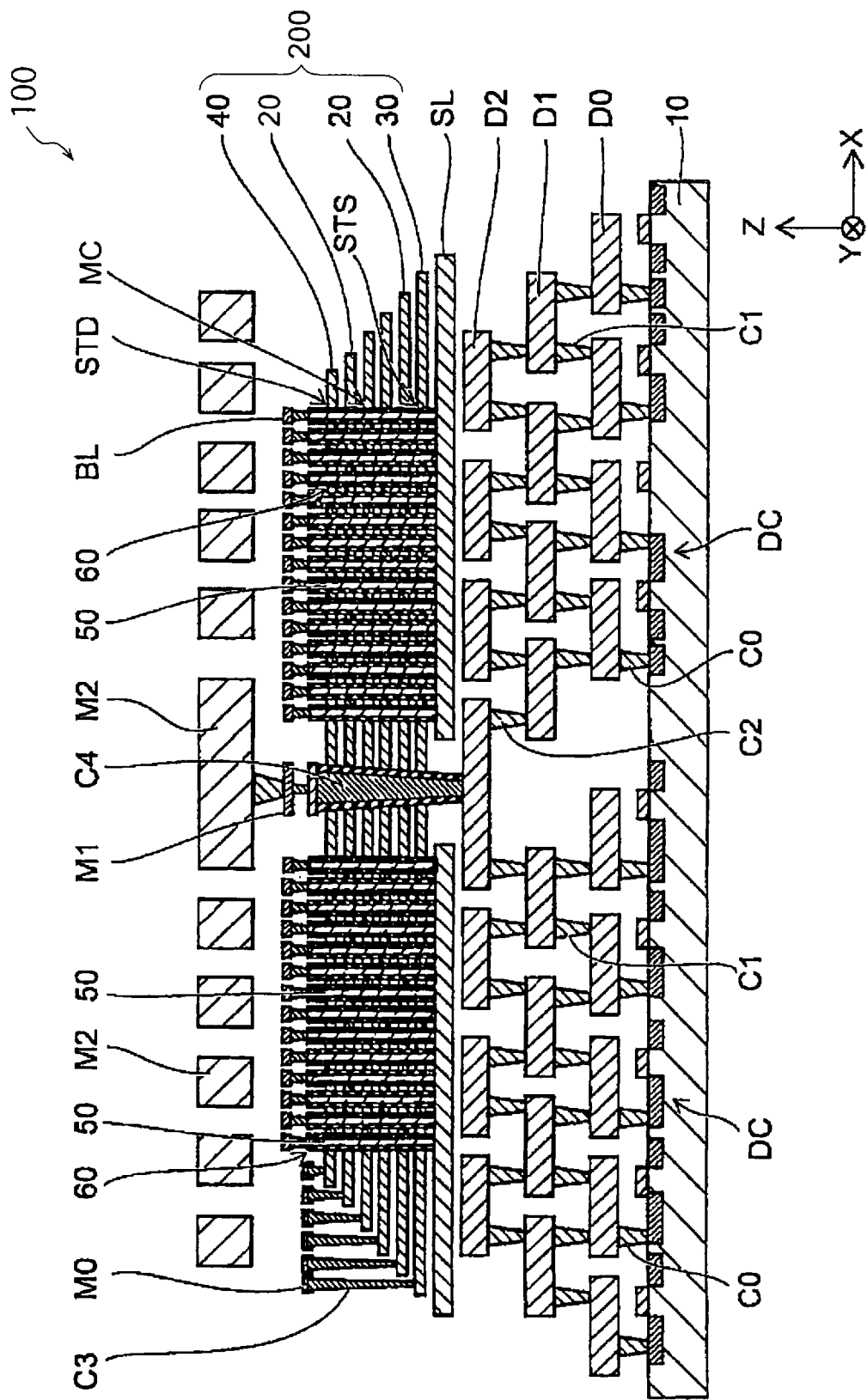
FIG. 21 is a cross-sectional view illustrating a structure of a storage device which corresponds to one example of the semiconductor device of the first embodiment.

FIG. 21 is a cross-sectional view illustrating a structure of a storage device 100 that corresponds to an example of the semiconductor device of the first embodiment. The storage device 100 is, for example, a NAND type non-volatile storage device, and includes a memory cell MC disposed three-dimensionally. FIG. 21 omits the illustration of an insulating layer that electrically insulates each component of the storage device 100.

As illustrated in FIG. 21, the storage device 100 includes a substrate 10 and wirings D0, D1, and D2. The substrate 10 is, for example, a silicon substrate, and a drive circuit DC of the memory cell MC is provided on an upper surface thereof. The wirings D0, D1 and D2 are sequentially stacked on the substrate 10, and electrically connect a circuit element such as a transistor or the like. The wiring D0 is connected to the circuit element on the substrate 10 via, for example, a contact plug C0. The wiring D1 is connected to the wiring D0 via, for example, a contact plug C1. The wiring D2 is connected to the wiring D1 via, for example, a contact plug C2. The substrate 10 corresponds to an example of the above-described substrate 11.

The storage device 100 further includes a stacked film 200 including a source line SL, a word line 20, select gates 30 and 40, and a channel layer 50. The source line SL is provided on the wiring D2. The source line SL is, for example, a plate-shaped conductor extending in the X direction and the Y direction. The word line 20 and the select gates 30 and 40 are stacked on the source line SL. The word line 20 is located between the select gate 30 and the select gate 40. The channel layer 50 extends in the Z direction through the word line 20 and the select gates 30 and 40. A lower end of the channel layer 50 is electrically connected to the source line SL. The stacked film 200 corresponds to one example of the lower stacked film 12, the intermediate film 13, and the upper stacked film 14 described above.

As illustrated in FIG. 21, the word line 20 and the select gates 30 and 40 include end portions provided in a stepped shape and are respectively connected to an M0 wiring via a contact plug C3. For example, the M0 wiring is connected to a row decoder in the drive circuit DC via a contact plug not illustrated in the drawing.

The memory cell MC is provided at a portion where the word line 20 and the channel layer 50 intersect each other. An insulating layer 60 is provided between the word line 20 and the channel layer 50. The insulating layer 60 extends in the Z direction along the channel layer 50, and functions as a charge retention layer at a portion located between the word line 20 and the channel layer 50. The channel layer 50 corresponds to an example of the above-described channel semiconductor layer 2.

A source-side select transistor STS is provided at a portion where the channel layer 50 and the select gate 30 intersect each other. A drain-side select transistor STD is provided at a portion where the channel layer 50 and the select gate 40 intersect each other.

The storage device 100 further includes a contact plug C4 extending in the Z direction through the word line 20, the select gates 30 and 40, and the source line SL. For example, the contact plug C4 is provided at a central portion of the word line 20, and a lower end thereof is connected to the wiring D2.

The storage device 100 further includes an M1 wiring and an M2 wiring. The M1 wiring is provided above the select gate 40, and includes, for example, a plurality of bit lines BL. The M2 wiring is provided on the M1 wiring.

Each bit line BL is electrically connected to one of the channel layers 50. The bit line BL is connected to the M2 wiring at a portion not illustrated in the drawing. The M2 wiring is electrically connected to the M2 wiring via the M1 wiring. That is, for example, the bit line BL is electrically connected to a sense amplifier provided in the drive circuit DC via the M2 wiring and the contact plug C4.

Figure 22:
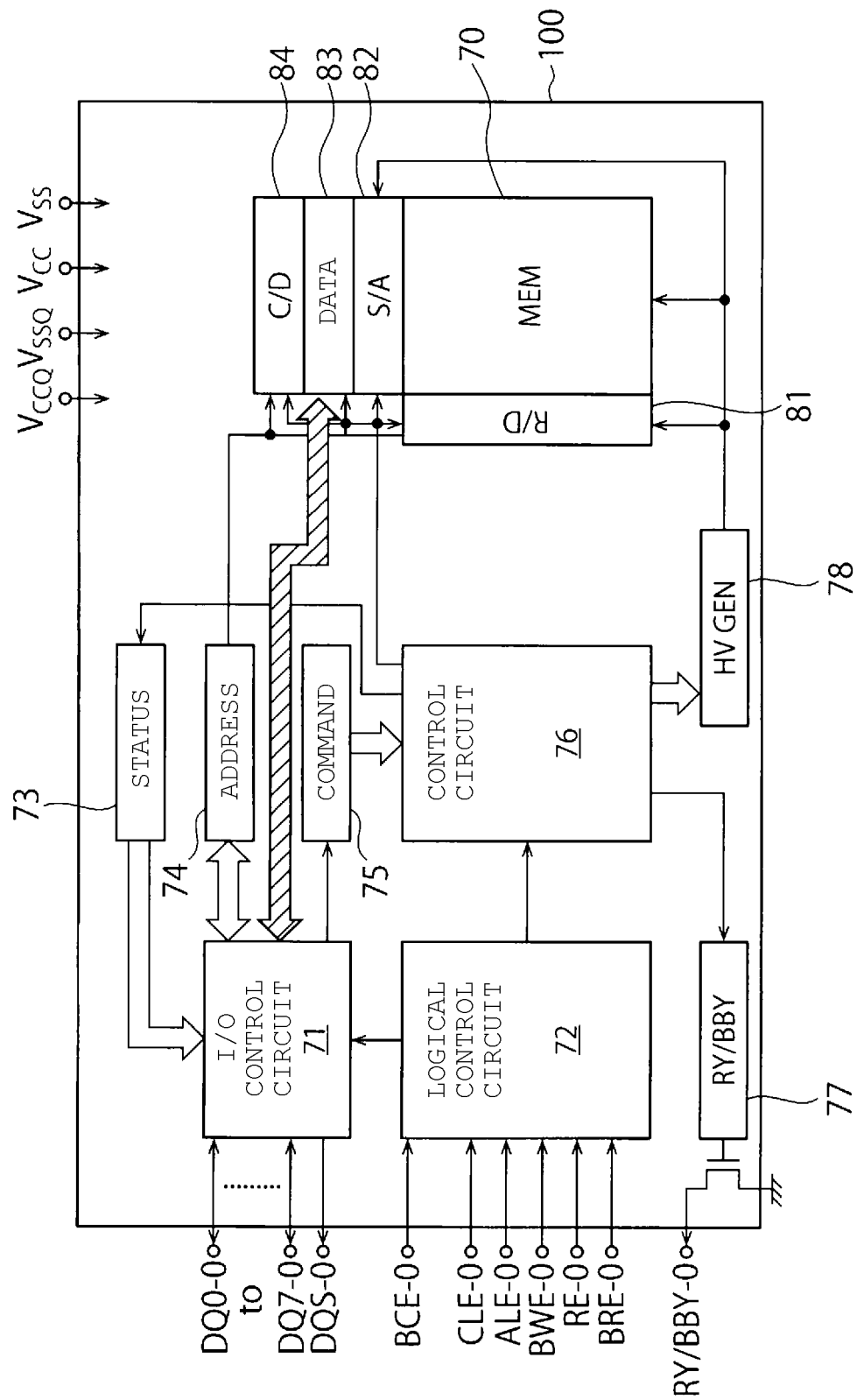
FIG. 22 is a circuit diagram illustrating a configuration of the storage device.

FIG. 22 is a circuit diagram illustrating a configuration of the storage device 100.

As illustrated in FIG. 22, the storage device 100 includes a memory cell array 70, an input and output (I/O) control circuit 71, a logical control circuit 72, a status register 73, an address register 74, a command register 75, a control circuit 76, a ready and busy circuit 77, a voltage generator 78, a row decoder 81, a sense amplifier 82, a data register 83, and a column decoder 84.

The I/O control circuit 71 transmits and receives an input signal and an output signal to and from a controller (not illustrated) via data lines DQ0-0 to DQ7-0. The logical control circuit 72 receives a chip enable signal BCE-0, a command latch enable signal CLE-0, an address latch enable signal ALE-0, a write enable signal BWE-0, and read enable signals RE-0 and BRE-0, and controls an operation of the I/O control circuit 71 and the control circuit 76 according to the signals.

The status register 73 stores the status of a read operation, a write operation, an erase operation, or the like, and is used to notify the controller of the completion of these operations. The address register 74 is used to store an address signal that the I/O control circuit 71 receives from the controller. The command register 75 is used to store a command signal that the I/O control circuit 71 receives from the controller.

The control circuit 76 controls the status register 73, the ready and busy circuit 77, the voltage generator 78, the row decoder 81, the sense amplifier 82, the data register 83, and the column decoder 84 according to the command signal of the command register 75, and performs the read operation, the write operation, the erase operation, or the like.

The ready and busy circuit 77 transmits a ready and busy signal RY/BBY-0 to the controller according to an operation condition of the control circuit 76. Accordingly, the control circuit 76 can notify whether the command can be received or not. The voltage generator 78 generates a voltage required for the read operation, the write operation, and the erase operation.

The row decoder 81 applies a voltage to a word line WL of the memory cell array 70. The sense amplifier 82 detects data read in the bit line BL of the memory cell array 70. The data register 83 is used to store data from the I/O control circuit 71 and the sense amplifier 82. The column decoder 84 decodes a column address, and selects a latch circuit in the data register 83 based upon a decoding result. The row decoder 81, the sense amplifier 82, the data register 83, and the column decoder 84 function as an interface of the read operation, the write operation, and the erase operation with respect to the memory cell array 70.

Figure 23:
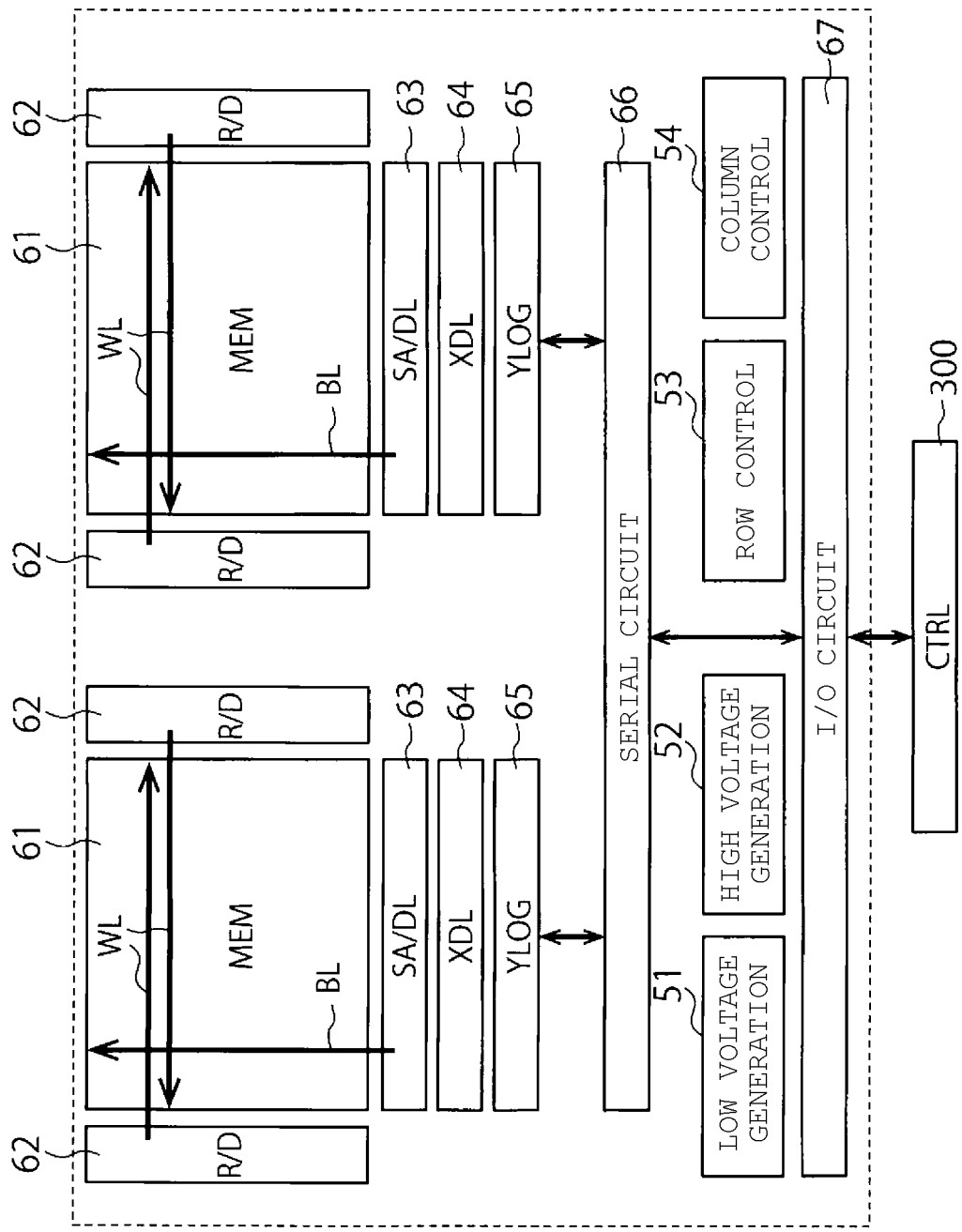
FIG. 23 is a block diagram illustrating a configuration related to a memory cell array.

FIG. 23 is a block diagram illustrating a configuration related to the memory cell array 70 in the storage device 100.

FIG. 23 illustrates a plurality of planes 61 that form the memory cell array 70, a plurality of row decoders 62 (=81) provided for these planes 61, a plurality of SA/DL portions 63, a plurality of XDL portions 64, and a plurality of YLOG portions 65. FIG. 23 further illustrates a serial circuit 66, an input and output (I/O) circuit 67, a low voltage generation circuit 51, a high voltage generation circuit 52, a row control circuit 53, and a column control circuit 54. FIG. 23 further illustrates a controller 300 provided in the storage device 100.

Each plane 61 is formed of a plurality of memory cells, a plurality of word lines WL, a plurality of bit lines BL, or the like. Each row decoder 62 applies a control voltage to a control wiring such as the word line WL or the like. Examples of the control voltage include a write voltage (VPRG), an erase voltage (VERASE), an intermediate voltage (VPASS), a source voltage (VSL), or the like. Each SA/DL portion 63 is a sense amplifier circuit and a data latch circuit that detect the data read by the bit line BL. Each XDL portion 64 is a data latch circuit that stores the data transmitted from the SA/DL portion 63 and the I/O circuit 67. Each YLOG portion 65 decodes the column address and selects the latch circuit in the XDL portion 64 based upon the decoding result. The serial circuit 66 provides a serial bus or the like shared by a plurality of planes 61, and the I/O circuit 67 transmits and receives an input signal and an output signal to and from the controller 300.

The low voltage generation circuit 51 and the high voltage generation circuit 52 forma control voltage generation circuit, and respectively generate a low voltage and a high voltage to be used as the control voltage. The row control circuit 53 and the column control circuit 54 respectively control the row and column of each plane 61.

As described above, the joint portion PJ of the columnar portion CL of the embodiment is formed to include the intermediate joint portion P1 and the upper joint portion P2 of which width is larger than a width of the intermediate joint portion P1. The joint portion PJ of the embodiment is formed to include the lower joint portion P3 of which width is larger than the width of the intermediate joint portion P1. Therefore, according to the embodiment, the channel semiconductor layer 2 can be desirably formed in the memory hole H, in which the channel semiconductor layer 2 can be prevented from being divided in the joint portion PJ.

Second Embodiment

Figure 14:
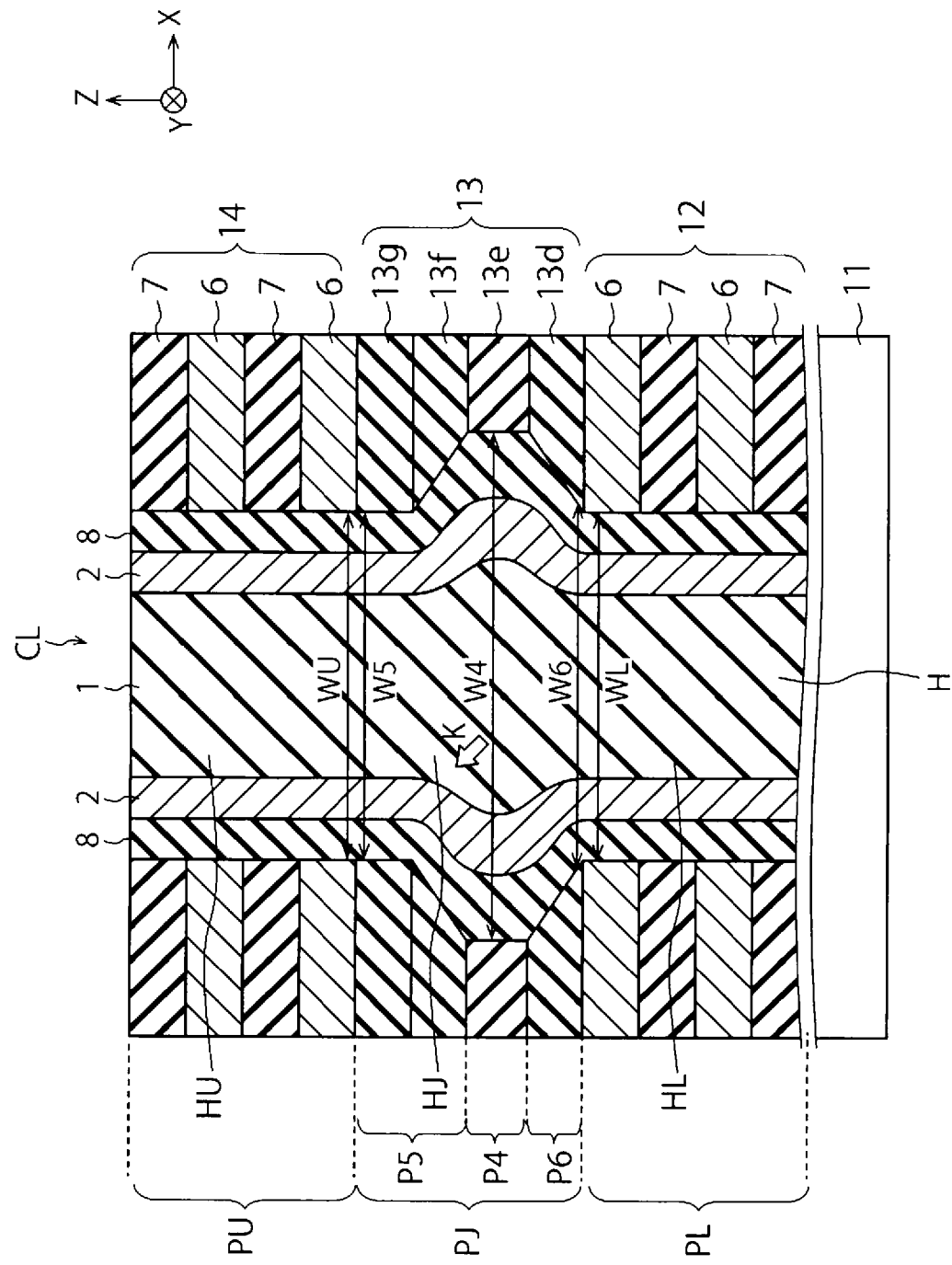
FIG. 14 is a cross-sectional view illustrating a structure of a semiconductor device of a second embodiment.

FIG. 14 is a cross-sectional view illustrating a structure of a semiconductor device of a second embodiment.

In the same manner as that of the semiconductor device of the first embodiment, the semiconductor device of the embodiment includes the substrate 11, the lower stacked film 12, the intermediate film 13, the upper stacked film 14, and the columnar portion CL. It is noted that the intermediate film 13 of the embodiment includes an insulating layer 13d, an insulating layer 13e, an insulating layer 13f, and an insulating layer 13g that are sequentially formed on the lower stacked film 12. The insulating layer 13d is, for example, the SiON film. The insulating layer 13e is, for example, the SiO$_2$ film. The insulating layer 13f is, for example, the SiON film. The insulating layer 13g is, for example, the metal insulating film. As described above, the insulating layer 13e of the embodiment is formed of a material (SiO$_2$) different from a material of the insulating layer 13f (SiON), a material of the insulating layer 13d (SiON), and a material of the insulating layer 13g (the metal insulating material). The insulating layer 13g of the embodiment is formed of the material (the metal insulating material) different from the material of the insulating layer 13f (SiON). The insulating layer 13e is an example of a fourth insulating layer. The insulating layer 13f is an example of a fifth insulating layer. The insulating layer 13d is an example of a sixth insulating layer. The insulating layer 13g is an example of a seventh insulating layer.

The insulating layer 13e of the embodiment may have a density different from a density of the insulating layer 13f, a density of the insulating layer 13d, and a density of the insulating layer 13g. For example, the density of the insulating layer 13e of the embodiment may be lower than the density of the insulating layer 13f, the density of the insulating layer 13d, and the density of the insulating layer 13g. Here, the material of the insulating layer 13e may be the same as at least one of the material of the insulating layer 13f, the material of the insulating layer 13d, and the material of the insulating layer 13g, and may be different from at least one of the material of the insulating layer 13f, the material of the insulating layer 13d, and the material of the insulating layer 13g.

The insulating layer 13g of the embodiment may have a density different from the density of the insulating layer 13f. For example, the density of the insulating layer 13g of the embodiment may be higher than the density of the insulating layer 13f. Here, the material of the insulating layer 13g may be the same as the material of the insulating layer 13f, or may be different from the material of the insulating layer 13f. Details of the insulating layers 13d, 13e, 13f, and 13g will be further described later.

Hereinafter, continuously, details of the joint portion PJ of the embodiment will be further described with reference to FIG. 14.

In the embodiment, the joint portion PJ includes an intermediate joint portion P4, an upper joint portion P5, and a lower joint portion P6. The upper joint portion P5 is provided at a location higher than that of the intermediate joint portion P4, and the lower joint portion P6 is provided at a location lower than that of the intermediate joint portion P4. In the embodiment, a side surface of the intermediate joint portion P4 is located in the radial direction in comparison with a side surface of the upper joint portion P5 and a side surface of the lower joint portion P6. The intermediate joint portion P4, the upper joint portion P5, and the lower joint portion P6 are examples of a fourth portion, a fifth portion, and a sixth portion, respectively.

In the embodiment, the intermediate joint portion P4 is provided in the insulating layer 13e, the upper joint portion P5 is provided in the insulating layers 13f and 13g, and the lower joint portion P6 is provided in the insulating layer 13d. In the embodiment, a side surface of the memory insulating film 8 in the upper joint portion P5 is in contact with a side surface of the insulating layer 13f, and the side surfaces are inclined in the Z direction. In the same manner, the side surface of the memory insulating film 8 in the lower joint portion P6 is in contact with a side surface of the insulating layer 13d, and the side surfaces are inclined in the Z direction.

FIG. 14 illustrates a width W4 in the X direction of the intermediate joint portion P4, a width W5 in the X direction of the upper joint portion P5, and a width W6 in the X direction of the lower joint portion P6. Specifically, the width W5 indicates a width near an upper end of the upper joint portion P5, and the width W6 indicates a width near a lower end of the lower joint portion P6. As illustrated in FIG. 14, the joint portion PJ of the embodiment protrudes in the radial direction with respect to a side surface of the lower columnar portion PL and a side surface of the upper columnar portion PU in the insulating layers 13d, 13e, and 13f. Therefore, while the widths W4 and W6 of the embodiment are larger than the widths WL and WU (W4 and W6>WL and WU), the width W5 of the embodiment is the same as the width WU (W5=WU). It is noted that the width of the upper joint portion P5 is also larger than the width WU in the insulating layer 13f. As described above, the side surface of the intermediate joint portion P4 of the embodiment is located in the radial direction in comparison with the side surface of the upper joint portion P5 and the side surface of the lower joint portion P6. Therefore, the widths W5 and W6 of the embodiment are smaller than the width W4 (W5 and W6<W4). The widths W4, W5, and W6 are examples of a fourth width, a fifth width, and a sixth width, respectively.

A difference between the width W4 and the widths W5 and W6 of the embodiment is caused by, for example, a difference between an etching ratio of the insulating layer 13e and etching ratios of the insulating layers 13f, 13d, and 13g. Details of these etching ratios will be described later.

FIG. 14 illustrates a corner portion K of the channel semiconductor layer 2 in the upper joint portion P5. In the upper joint portion P5 of the embodiment, the width of the columnar portion CL gradually changes from the width W4 of the intermediate joint portion P4 to the width WU of the upper columnar portion PU. Therefore, the curvature of the channel semiconductor layer 2 at the corner portion K of the embodiment is gentle in the same manner as that of the curvature of the channel semiconductor layer 2 at the corner portion K of the first embodiment. As a result, the channel semiconductor layer 2 is prevented from being divided near the corner portion K. As described above, according to the embodiment, the intermediate joint portion P4 and the upper joint portion P5 are provided in the joint portion PJ, thereby making it possible to prevent the channel semiconductor layer 2 from being divided near the corner portion K. According to the embodiment, the joint portion PJ is further provided with the lower joint portion P6, thereby making it also possible to prevent the channel semiconductor layer 2 from being divided at the corner portion near the boundary between the joint portion PJ and the lower columnar portion PL.

Figure 15:
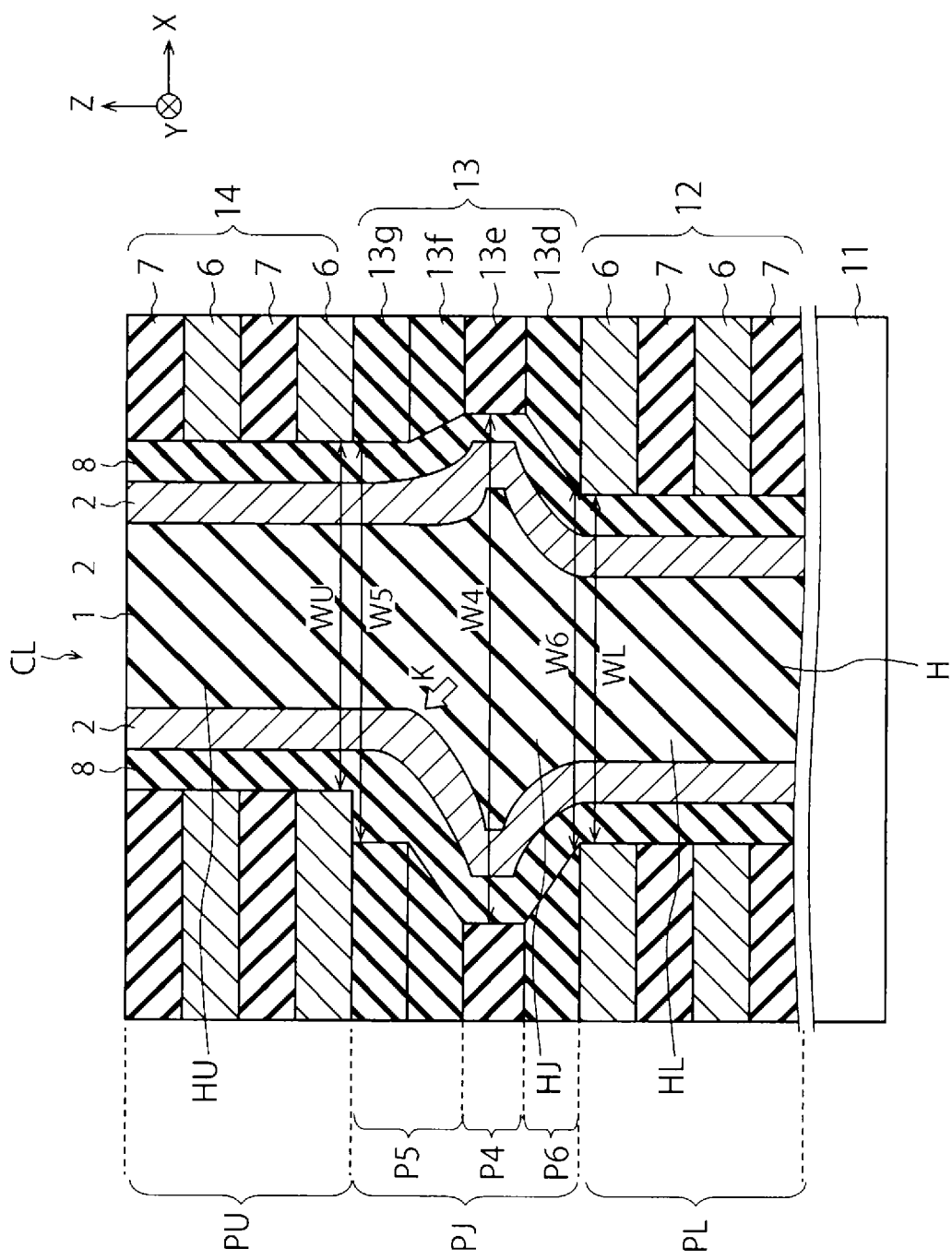
FIG. 15 is a cross-sectional view illustrating a structure of a semiconductor device of a modification of the second embodiment.

FIG. 15 is a cross-sectional view illustrating a structure of a semiconductor device of a modification of the second embodiment.

In the modification, the upper memory hole HU causes a positional deviation in the X direction with respect to the joint hole HJ. That is, a central axis of the upper memory hole HU is not located at a central axis of the joint hole HJ, but is located at a portion of the joint hole HJ further moved to the X direction from the central axis thereof. As a result, when the upper memory hole HU is formed in the upper stacked film 14 by etching, a part of the insulating layer 13 is also removed by the etching. Therefore, a planar shape of the upper joint portion P5 of the modification is slightly deformed from a circular shape. For example, the width W5 of the upper joint portion P5 of the modification becomes larger than the width WU of the upper columnar portion PU due to this deformation (W5>WU).

In the upper joint portion P5 of the modification, the width of the columnar portion CL gradually changes from the width W4 to the width W5. Therefore, the curvature of the channel semiconductor layer 2 at the corner portion K of the modification also becomes gentle in the same manner as that of the curvature of the channel semiconductor layer 2 at the corner portion K of the first and second embodiments. As a result, the channel semiconductor layer 2 of the modification is prevented from being divided near the corner portion K. Such division of the channel semiconductor layer 2 is also prevented at the corner portion near the boundary between the joint portion PJ and the lower columnar portion PL.

Figure 16:
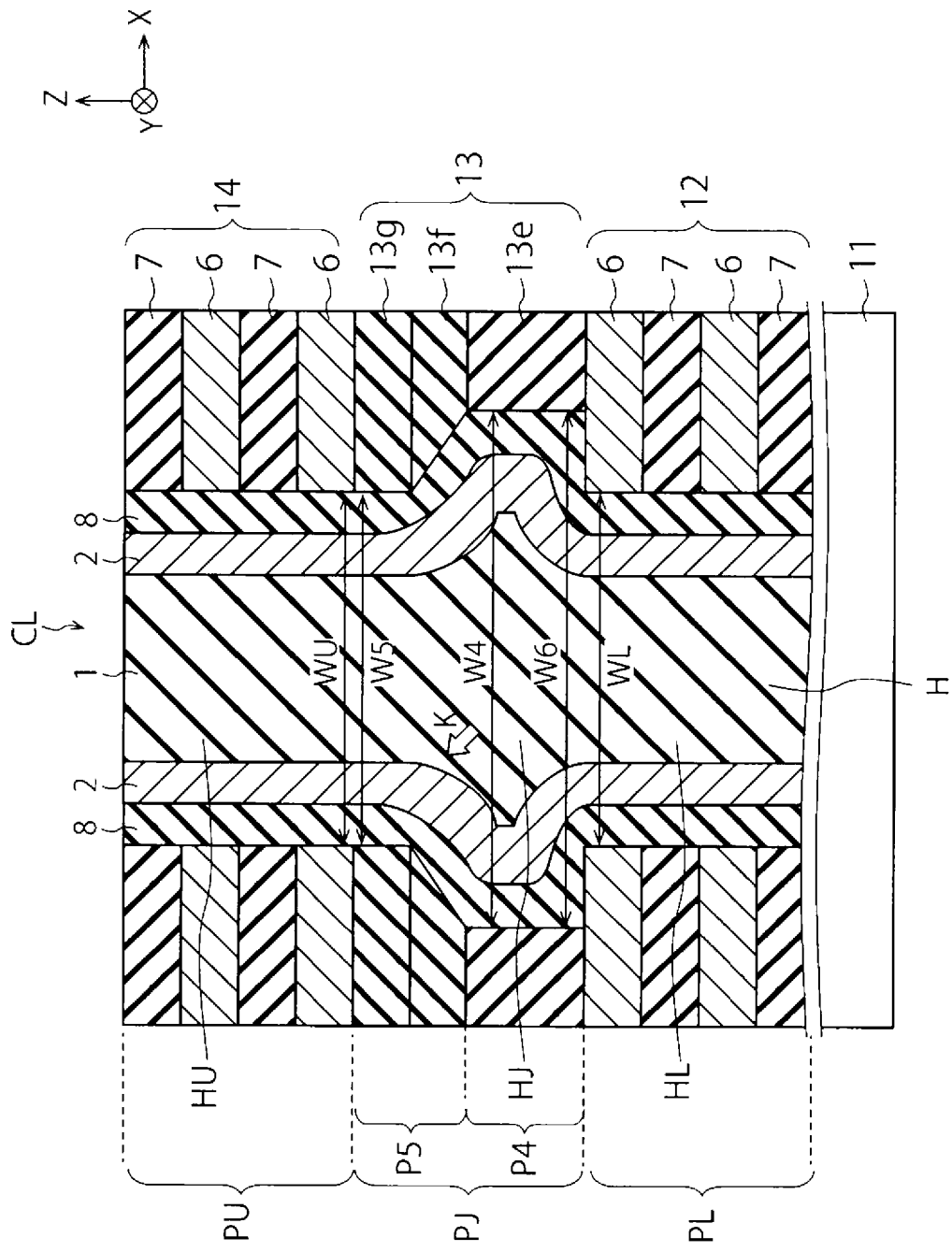
FIG. 16 is a cross-sectional view illustrating a structure of a semiconductor device of another modification of the second embodiment.

FIG. 16 is a cross-sectional view illustrating a structure of a semiconductor device of another modification of the second embodiment.

The intermediate film 13 of the modification includes the insulating layers 13e, 13f, and 13g, and does not include the insulating layer 13d. Therefore, the joint portion PJ of the modification does not include the lower joint portion P6. The width W6 of the modification indicates a width near a lower end of the intermediate joint portion P4. The width W6 of the modification is the same as the width W4 (W6=W4).

In the upper joint portion P5 of the modification, the width of the columnar portion CL gradually changes from the width W4 to the width W5. Therefore, the curvature of the channel semiconductor layer 2 at the corner portion K of the modification also becomes gentle in the same manner as that of the curvature of the channel semiconductor layer 2 at the corner portion K of the first and second embodiments. As a result, the channel semiconductor layer 2 of the modification is prevented from being divided near the corner portion K.

On the other hand, such division of the channel semiconductor layer 2 may occur at the corner portion near the boundary between the joint portion PJ and the lower columnar portion PL. However, as described above, the width WL near the upper end of the lower columnar portion PL is often larger than the width WU near the lower end of the upper columnar portion PU (WL>WU). Here, even though the lower joint portion P6 is not provided in the joint portion PJ, the channel semiconductor layer 2 can be prevented from being divided even at this corner portion.

The modifications illustrated in FIGS. 15 and 16 may also be applied to the semiconductor device of the first embodiment. That is, the positional deviation of the upper memory hole HU may occur in the first embodiment, and the lower joint portion P3 may not be provided in the joint portion PJ of the first embodiment. In such cases as well, an effect described with reference to FIGS. 15 and 16 can be achieved.

FIGS. 17 to 20 are cross-sectional views illustrating a method for manufacturing the semiconductor device of the second embodiment. In the description of the method for manufacturing the semiconductor device of the embodiment, the description of a common point with the method for manufacturing the semiconductor device of the first embodiment will be appropriately omitted.

Figure 17A:
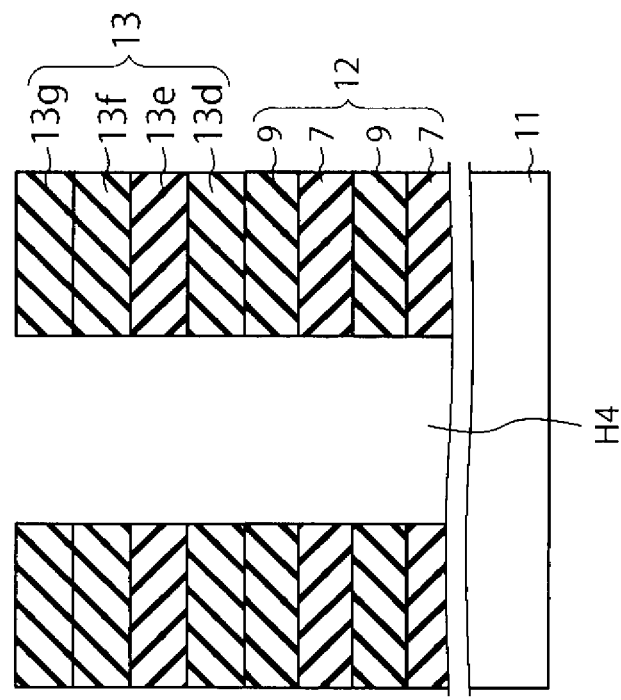
FIGS. 17A and 17B are cross-sectional views (1/4) illustrating a method for manufacturing the semiconductor device of the second embodiment.
Figure 17B:
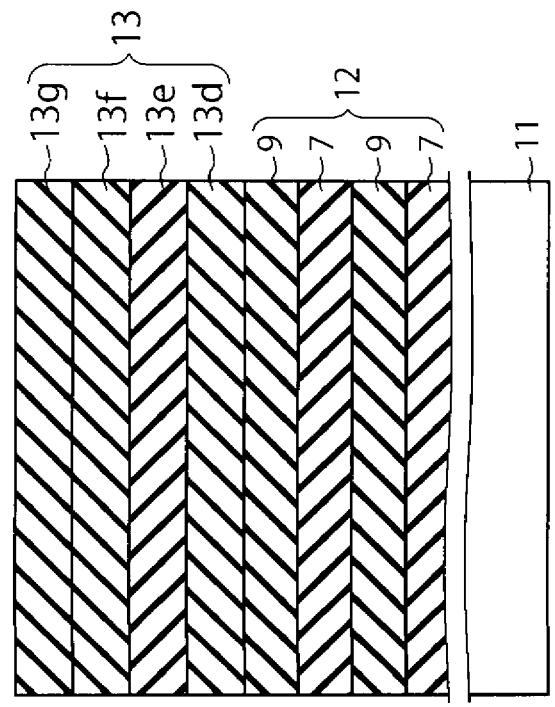

First, the lower stacked film 12 and the intermediate film 13 are sequentially formed on the substrate 11 (FIG. 17A). The lower stacked film 12 is formed by alternately stacking a plurality of sacrifice layers 9 and a plurality of insulating layers 7 on the substrate 11. The intermediate film 13 is formed by sequentially stacking the insulating layer 13d, the insulating layer 13e, the insulating layer 13f, and the insulating layer 13g on the lower stacked film 12. Next, a hole H4 penetrating the intermediate film 13 and the lower stacked film 12 is formed by etching (FIG. 17B). The hole H4 becomes a part of the memory hole H as described later.

Figure 18B:
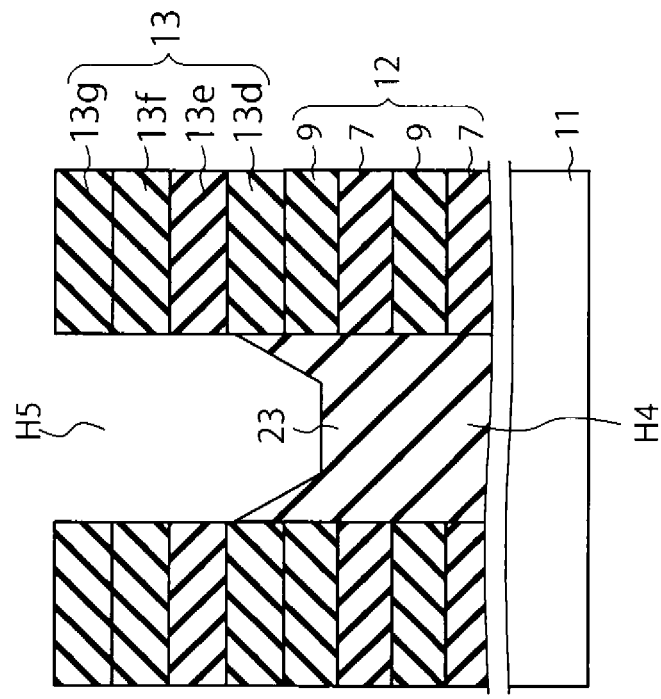
FIGS. 18A and 18B are cross-sectional views (2/4) illustrating the method for manufacturing the semiconductor device of the second embodiment.
Figure 18A:
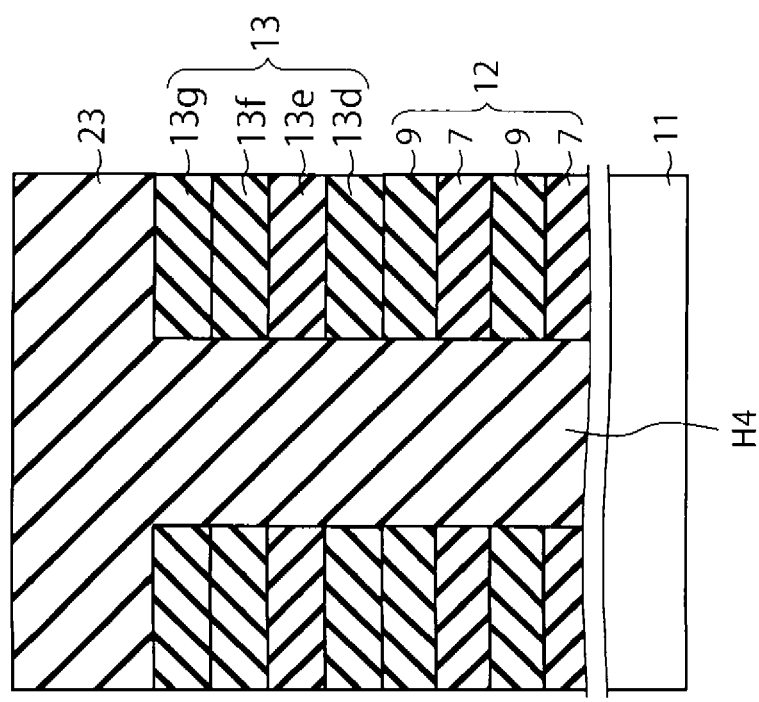

Next, the resist film 23 is formed on the whole surface of the substrate 11 (FIG. 18A). As a result, the hole H4 is filled with the resist film 23. Next, a part of the resist film 23 is removed by etching (FIG. 18B). As a result, a part of the resist film 23 in the hole H4 is removed. A hole H5 illustrated in FIG. 18B is an area where the resist film 23 is removed from the hole H4. The hole H5 is formed so that a side surface of the insulating layer 13g, a side surface of the insulating layer 13f, a side surface of the insulating layer 13e, and a part of a side surface of the insulating layer 13d are exposed.

Next, the intermediate film 13 is processed by etching (FIG. 19A). In the embodiment, the insulating layers 13d and 13f are, for example, the SiON film, the insulating layer 13e is, for example, the SiO$_2$ film, and the insulating layer 13g is, for example, the metal insulating film. Therefore, the insulating layer 13e is processed at an etching ratio different from etching ratios of the insulating layers 13d, 13f, and 13g, and the insulating layers 13d and 13f are processed at the etching ratio different from the etching ratio of the insulating layer 13g. In the embodiment, the etching ratio of the insulating layer 13e is increased, the etching ratios of the insulating layers 13d and 13f is decreased, and the etching ratio of the insulating layer 13g is further decreased. As a result, the side surface of the insulating layer 13e is etched faster than the side surfaces of the insulating layers 13d and 13f, the side surfaces of the insulating layers 13d and 13f are etched faster than the side surface of the insulating layer 13g, and the hole H5 changes to the above-described joint hole HJ. On the other hand, the hole H4 other than the hole H5 becomes the above-described lower memory hole HL.

The insulating layer 13e of the embodiment is formed of the same material as the material of the insulating layer 13d and the material of the insulating layer 13f, and may have a density different from the density of the insulating layer 13d and the density of the insulating layer 13f. For example, the density of the insulating layer 13e may be lower than the density of the insulating layer 13d and the density of the insulating layer 13f. Accordingly, even though the materials of the insulating layers 13d, 13e, and 13f are the same, the etching ratio of the insulating layer 13e can be increased and the etching ratio of the insulating layers 13d and 13e can be reduced.

The insulating layer 13f of the embodiment may be formed of the same material as the material of the insulating layer 13g, and may have a density different from the density of the insulating layer 13g. For example, the density of the insulating layer 13f may be lower than the density of the insulating layer 13g. Accordingly, even though the materials of the insulating layers 13f and 13g are the same, the etching ratio of the insulating layer 13f can be increased and the etching ratio of the insulating layer 13g can be reduced.

Next, the hole H5 is filled with a resist film not illustrated in the drawing, the upper stacked film 14 is formed on the intermediate film 13 and the resist film, a hole H6 penetrating the upper stacked film 14 is formed by etching, and then the resist film and the resist film 23 are removed (FIG. 19B). The upper stacked film 14 is formed by alternately stacking a plurality of sacrifice layers 9 and a plurality of insulating layers 7 on the intermediate film 13.

The hole H6 illustrated in FIG. 19B is formed on the hole H5 and becomes the above-described upper memory hole HU. As such, the memory hole H including the lower memory hole HL, the joint hole HJ, and the upper memory hole HU is formed in the lower stacked film 12, the intermediate film 13, and the upper stacked film 14.

Next, the memory insulating film 8, the channel semiconductor layer 2, and the core insulating film 1 are sequentially formed in the memory hole H, and then the sacrifice layer 9 of the lower stacked film 12 and the sacrifice layer 9 of the upper stacked film 14 are removed by etching (FIG. 20A). As a result, the columnar portion CL is formed in the memory hole H. The sacrifice layer 9 is removed from the slits formed in the upper stacked film 14, the intermediate film 13, and the lower stacked film 12. As a result, the recess portion C is formed in an area where the sacrifice layer 9 is removed.

FIG. 20A illustrates the lower columnar portion PL formed in the lower memory hole HL, the joint portion PJ formed in the joint hole HJ, and the upper columnar portion PU formed in the upper memory hole HU. As such, the columnar portion CL including the lower columnar portion PL, the joint portion PJ, and the upper columnar portion PU is formed in the lower stacked film 12, the intermediate film 13, and the upper stacked film 14.

Next, the electrode layer 6 is formed in each recess portion C (FIG. 20B). As a result, the lower stacked film 12 and the upper stacked film 14 including the electrode layer 6 are formed on the substrate 11. As such, the semiconductor device illustrated in FIG. 14 is manufactured.

The semiconductor device illustrated in FIG. 15 is manufactured when the positional deviation of the hole H6 occurs in the process illustrated in FIG. 19B. The semiconductor device illustrated in FIG. 16 is manufactured when the formation of the insulating layer 13d is omitted in the process illustrated in FIG. 17A.

As described above, the joint portion PJ of the columnar portion CL of the embodiment is formed to include the intermediate joint portion P4 and the upper joint portion P5 of which width is smaller than the width of the intermediate joint portion P4. The joint portion PJ of the embodiment is formed to include the lower joint portion P6 of which width is smaller than the width of the intermediate joint portion P4. Therefore, according to the embodiment, the channel semiconductor layer 2 can be desirably formed in the memory hole H, in which the channel semiconductor layer 2 can be prevented from being divided in the joint portion PJ.

While certain embodiments have been described, the embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
    a first stacked film including a plurality of first electrode layers separated from each other;
    an insulating layer provided on the first stacked film;
    a second stacked film provided on the insulating layer and including a plurality of second electrode layers separated from each other; and
    a columnar portion including a first insulating film, a charge storage layer, a second insulating film, and a semiconductor layer, and extending along a first direction through the first stacked film, the insulating layer, and the second stacked film, wherein
    the columnar portion extending in the insulating layer includes a first portion having a first width in a second direction intersecting the first direction, and a second portion provided at a different location along the first direction and having a second width in the second direction,
    the columnar portion extending in the second stacked film includes a third portion having a third width along the second direction,
    the second width is larger than the first width and the third width.

2. The semiconductor device according to claim 1, wherein
    a thickness, in the first direction, of the second portion is equal to or less than twice a total film thickness of the first insulating film, the charge storage layer, and the second insulating film.

3. The semiconductor device according to claim 1, wherein
    the first width is larger than the third width.

4. The semiconductor device according to claim 1, wherein
    the columnar portion extending in the insulating layer further includes a third portion provided on an opposite side of the first portion as the second portion along the first direction,
    the columnar portion extending in the first stacked film and having a fifth width along the second direction,
    wherein the fourth width is larger than the first width and the fifth width.

5. The semiconductor device according to claim 4, wherein
    a thickness in the first direction of the third portion is equal to or less than twice a total film thickness of the first insulating film, the charge storage layer, and the second insulating film.

6. The semiconductor device according to claim 4, wherein
    the first width is larger than the fifth width.

7. The semiconductor device according to claim 4, wherein
    a width of an outer peripheral surface of the semiconductor layer adjacent the first portion is larger than a width of the outer peripheral surface of the semiconductor layer adjacent any of the second and third portions.

8. The semiconductor device according to claim 4, wherein
    a width of an inner peripheral surface of the semiconductor layer adjacent the first portion is larger than a width of the inner peripheral surface of the semiconductor layer adjacent any of the second and third portions.

9. The semiconductor device according to claim 4, wherein
the insulating layer includes a first insulating layer, a second insulating layer provided on the first insulating layer, and a third insulating layer provided under the first insulating layer,
at least a portion of the first portion extends in the first insulating layer,
at least a portion of the second portion extends in the second insulating layer, and
at least a portion of the third portion extends in the third insulating layer.

10. The semiconductor device according to claim 9, wherein
the first insulating layer is formed of a material different from a material of the second insulating layer and a material of the third insulating layer.

11. The semiconductor device according to claim 9, wherein
the first insulating layer has a density different from a density of the second insulating layer and a density of the third insulating layer.

12. A semiconductor device, comprising:
a first stacked film including a plurality of first electrode layers separated from each other;
an insulating layer provided on the first stacked film;
a second stacked film provided on the insulating layer and including a plurality of second electrode layers separated from each other; and
a columnar portion including a first insulating film, a charge storage layer, a second insulating film, and a semiconductor layer, and extending along a first direction through the first stacked film, the insulating layer, and the second stacked film, wherein
the columnar portion extending in the insulating layer includes a fourth portion having a fourth width in a second direction intersecting the first direction, and a fifth portion provided higher than the fourth portion and having a fifth width in the second direction, and
wherein the fifth width is smaller than the fourth width and larger than a sixth width in the second direction of the columnar portion extending in the second stacked film.

13. The semiconductor device according to claim 12, wherein
a side surface of the fifth portion is inclined with respect to the first direction.

14. The semiconductor device according to claim 12, wherein
the columnar portion extending in the insulating layer further includes a sixth portion provided lower than that of the fourth portion and having a seventh width smaller than the fourth width and larger than an eighth width of the columnar portion extending in the first stacked film.

15. The semiconductor device according to claim 14, wherein
the side surface of the seventh portion is inclined with respect to the first direction.

16. The semiconductor device according to claim 14, wherein
the insulating layer includes a fourth insulating layer, a fifth insulating layer provided on the fourth insulating layer, and a sixth insulating layer provided under the fourth insulating layer,
at least a portion of the fourth portion extends in the fourth insulating layer,
at least a portion of the fifth portion extends in the fifth insulating layer, and
at least a portion of the sixth portion extends in the sixth insulating layer.

17. The semiconductor device according to claim 16, wherein
the insulating layer further includes a seventh insulating layer provided on the fifth insulating layer, and
at least a portion of the second portion extends in the fifth and seventh insulating layers.

* * * * *